US012812842B2

(12) United States Patent
Choi et al.

(10) Patent No.: US 12,812,842 B2
(45) Date of Patent: Nov. 24, 2026

(54) SEMICONDUCTOR DEVICES HAVING GATE STRUCTURES

(71) Applicant: Samsung Electronics Co., Ltd., Suwon-si (KR)

(72) Inventors: Minho Choi, Suwon-si (KR); Kiseok Lee, Suwon-si (KR); Chansic Yoon, Suwon-si (KR); Chulkwon Park, Suwon-si (KR); Jaybok Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 385 days.

(21) Appl. No.: 18/529,698

(22) Filed: Dec. 5, 2023

(65) Prior Publication Data

US 2024/0284657 A1 Aug. 22, 2024

(30) Foreign Application Priority Data

Feb. 21, 2023 (KR) ........................ 10-2023-0022800

(51) Int. Cl.
*H10B 12/00* (2023.01)

(52) U.S. Cl.
CPC ........... *H10B 12/34* (2023.02); *H10B 12/315* (2023.02); *H10B 12/482* (2023.02)

(58) Field of Classification Search
CPC .... H10B 12/34; H10B 12/315; H10B 12/482; H10B 12/053; H10B 12/485; H10D 89/10
See application file for complete search history.

(56) References Cited

U.S. PATENT DOCUMENTS

| | | | | |
|---|---|---|---|---|
| 7,615,496 | B2 | 11/2009 | Lee et al. | |
| 9,165,935 | B2 | 10/2015 | Chung et al. | |
| 10,361,205 | B2 * | 7/2019 | Cho ...................... | H10B 12/20 |
| 2012/0083126 | A1 | 4/2012 | Lee et al. | |
| 2013/0115745 | A1 | 5/2013 | Chung et al. | |
| 2013/0122685 | A1 | 5/2013 | Kim | |
| 2014/0159148 | A1 | 6/2014 | Chung et al. | |

(Continued)

FOREIGN PATENT DOCUMENTS

| | | | |
|---|---|---|---|
| KR | 10-2005-0040642 | A | 5/2005 |
| KR | 100790998 | B1 | 1/2008 |
| KR | 10-2013-0050160 | A | 5/2013 |

(Continued)

*Primary Examiner* — David Vu
(74) *Attorney, Agent, or Firm* — HARNESS, DICKEY & PIERCE, P.L.C.

(57) ABSTRACT

A semiconductor device includes a substrate having a plurality of active regions and defining a plurality of first gate trenches and a plurality of second gate trenches crossing the plurality of active regions and extending in a first horizontal direction, a plurality of gate structures including a plurality of first gate structures within the plurality of first gate trenches and a plurality of second gate structures within the plurality of second gate trenches, a bit line structure crossing the plurality of gate structures and extending in a second horizontal direction that intersects the first horizontal direction, and a contact plug disposed on a side surface of the bit line structure. When viewed in plan view, an area of at least some of the plurality of first gate structures is different from an area of at least some of the plurality of second gate structures.

20 Claims, 36 Drawing Sheets

(56) References Cited

U.S. PATENT DOCUMENTS

2021/0104529 A1 4/2021 Choi et al.

FOREIGN PATENT DOCUMENTS

| | | | |
|---|---|---|---|
| KR | 10-2013-0054011 | A | 5/2013 |
| KR | 10-2014-0073161 | A | 6/2014 |
| KR | 101866997 | B1 | 6/2018 |
| KR | 10-2021-0040708 | A | 4/2021 |

* cited by examiner

SEMICONDUCTOR DEVICES HAVING GATE STRUCTURES

CROSS-REFERENCE TO RELATED APPLICATION(S)

This application claims the benefit under 35 USC 119(a) of Korean Patent Application No. 10-2023-0022800 filed on Feb. 21, 2023 in the Korean Intellectual Property Office, the entire disclosure of which is incorporated herein by reference for all purposes.

BACKGROUND

Various example embodiments relate to a semiconductor device including a gate structure.

As demands for high performance, high speed, and/or multifunctionality of semiconductor devices increase, a degree of integration of semiconductor devices is increasing. In manufacturing a semiconductor device with a fine pattern corresponding to the trend for higher integration of semiconductor devices, implementing patterns having a fine width or a fine separation distance is required or expected.

SUMMARY

Various example embodiments provide a semiconductor device in which a first gate structure and a second gate structure are alternately disposed.

According to some example embodiments, a semiconductor device includes a substrate having a plurality of active regions, the substrate defining a plurality of first gate trenches and a plurality of second gate trenches crossing the plurality of active regions and extending in a first horizontal direction; a plurality of gate structures including a plurality of first gate structures within the plurality of first gate trenches and a plurality of second gate structures within the plurality of second gate trenches; a bit line structure crossing the plurality of gate structures and extending in a second horizontal direction, that intersects the first horizontal direction; and a contact plug on a side surface of the bit line structure. When viewed in plan view, an area of at least some of the plurality of first gate structures is different from an area of at least some of the plurality of second gate structures.

Alternatively or additionally according to some example embodiments, a semiconductor device includes a substrate having a plurality of active regions and defining a plurality of first gate trenches and a plurality of second gate trenches crossing the plurality of active regions and extending in a first horizontal direction; a plurality of gate structures including a plurality of first gate structures within the plurality of first gate trenches and a plurality of second gate structures within the plurality of second gate trenches; a bit line structure crossing the plurality of gate structures and extending in a second horizontal direction that intersects the first horizontal direction; and a contact plug on a side surface of the bit line structure. The plurality of first gate structures are alternately arranged with the plurality of second gate structures in the second horizontal direction. The plurality of first gate structures have a length different from a length of the plurality of second gate structures in at least one direction among the first horizontal direction, the second horizontal direction, and a vertical direction.

Alternatively or additionally according to some example embodiments, a semiconductor device includes a substrate having a plurality of active regions and defining a plurality of first gate trenches and a plurality of second gate trenches crossing the plurality of active regions and extending in a first horizontal direction; a plurality of gate structures including a plurality of first gate structures within the plurality of first gate trenches and a plurality of second gate structures within the plurality of second gate trenches; a bit line structure crossing the plurality of gate structures and extending in a second horizontal direction that intersects the first horizontal direction; a contact plug on a side surface of the bit line structure; a landing pad on the contact plug; and a capacitor structure electrically connected to the landing pad. The plurality of first gate structures are alternately arranged with the plurality of second gate structures in the second horizontal direction. First and second ends of the plurality of first gate structures that are spaced apart from each other in the first horizontal direction are arranged in a zigzag pattern with first and second ends of the respective second gate structures that are spaced apart from each other in the first horizontal direction.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various example embodiments will be described with reference to the accompanying drawings.

Figure 1:
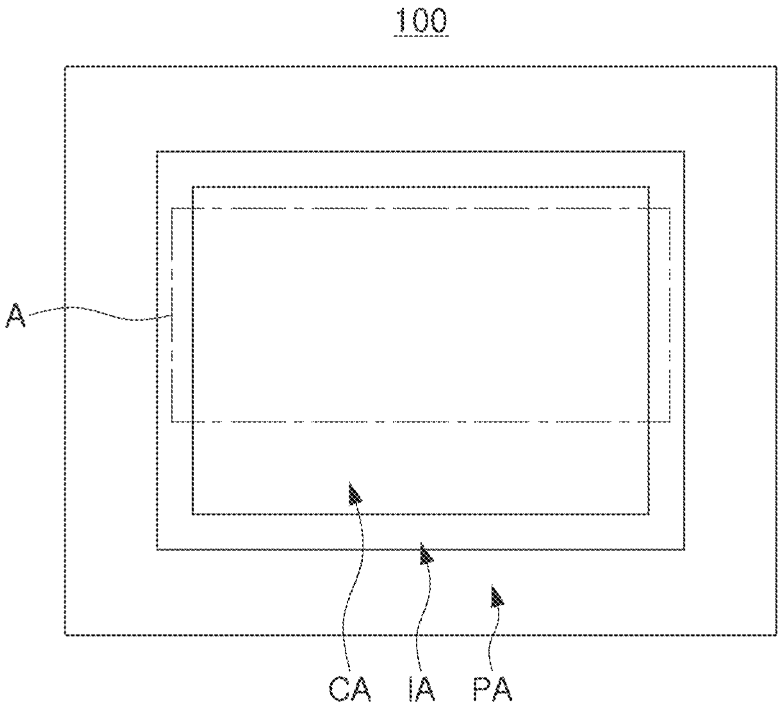
FIG. 1 is a plan view of a semiconductor device according to some example embodiments.

FIG. 1 is a plan view of a semiconductor device according to some example embodiments.

Referring to FIG. 1, a semiconductor device 100 according to various example embodiments may include a cell area CA, an interface area IA, and a peripheral circuit area PA. The peripheral circuit area PA may be disposed to surround the cell area CA, and the interface area IA may be disposed between the cell area CA and the peripheral circuit area PA. The semiconductor device 100 may be applied to, for example, a cell array of a dynamic random access memory (DRAM), but example embodiments are not limited thereto. The cell area CA may refer to an area in which the memory cells of the DRAM device are disposed or arranged, and the interface area IA may refer to an area between the cell area CA and the peripheral circuit area PA in which one or more of a row decoder, a column decoder, a row drive, and a sense amplifier are disposed.

Figure 2A:
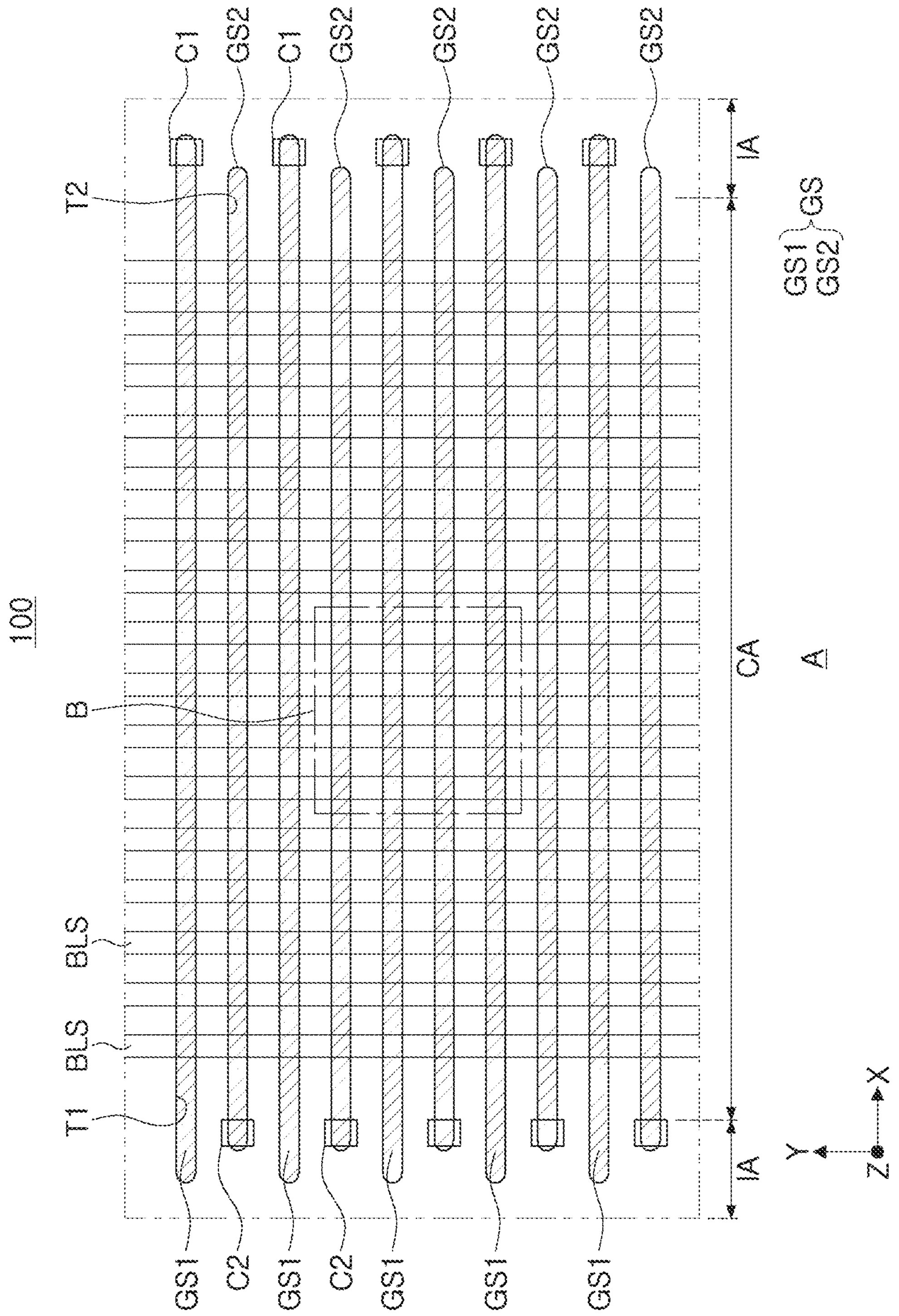
FIG. 2A is an enlarged view of a portion of the semiconductor device illustrated in FIG. 1.
Figure 2B:
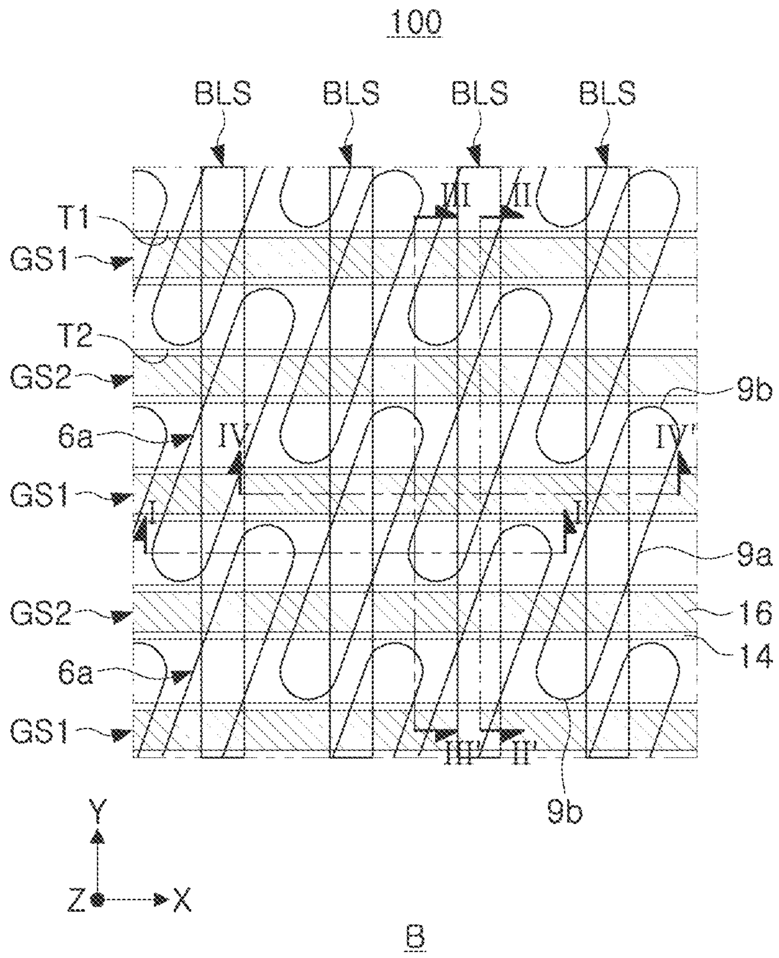
FIG. 2B is an enlarged view of a portion of the semiconductor device illustrated in FIG. 2A.
Figure 2C:
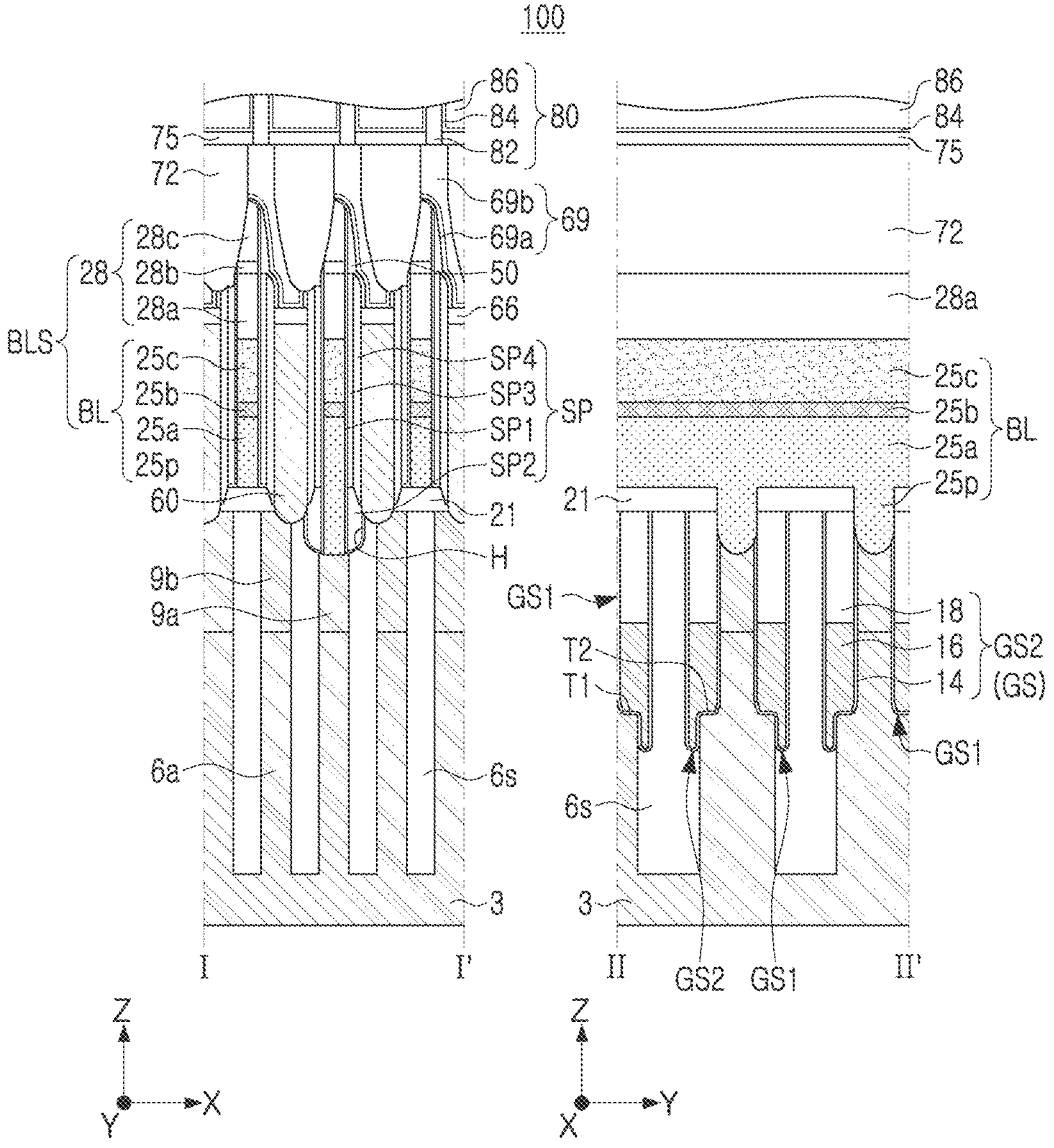
FIG. 2C provides vertical cross-sectional views of the semiconductor device illustrated in FIG. 2B, taken along lines I-I' and II-II'.
Figure 2D:
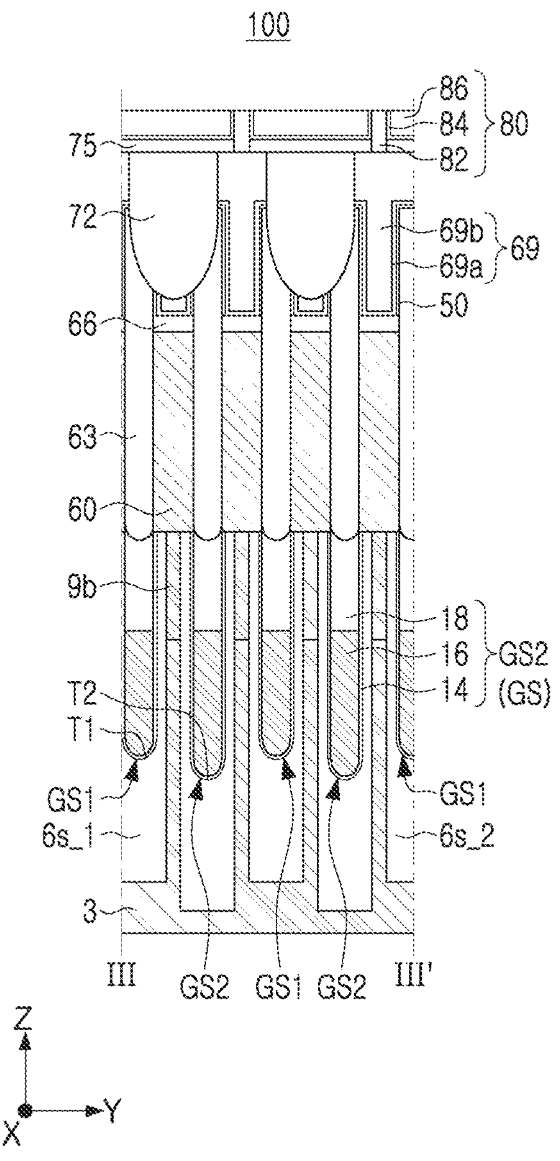
FIG. 2D is a vertical cross-sectional view of the semiconductor device illustrated in FIG. 2B taken along line III-III'.
Figure 2E:
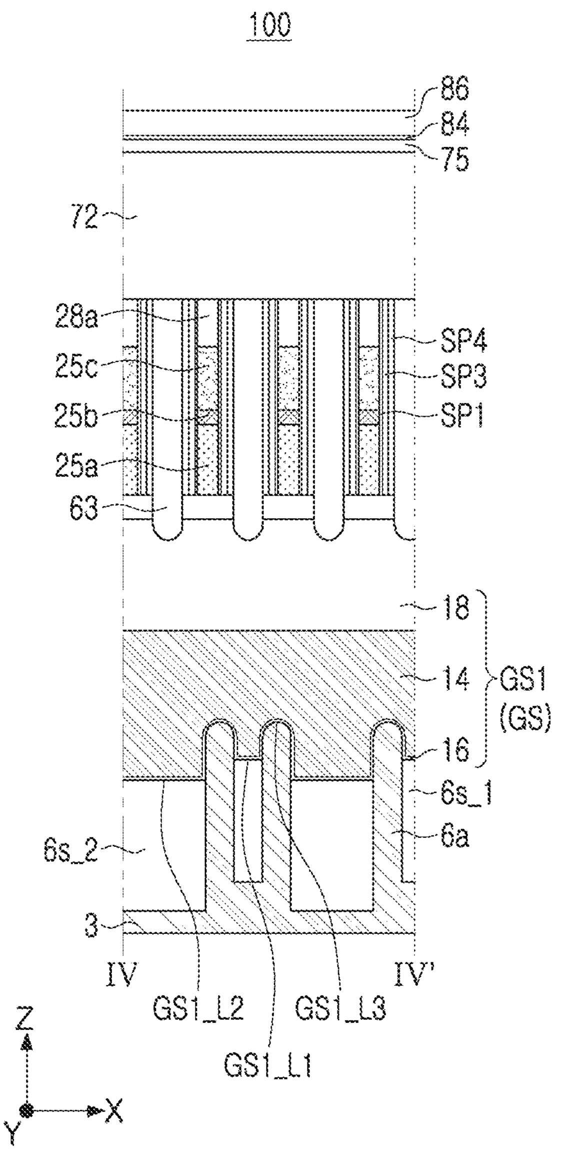
FIG. 2E is a vertical cross-sectional view of the semiconductor device illustrated in FIG. 2B taken along line IV-IV'.

FIG. 2A is an enlarged view of a portion of the semiconductor device illustrated in FIG. 1. FIG. 2A may correspond to area A of FIG. 1. FIG. 2B is an enlarged view of a portion of the semiconductor device illustrated in FIG. 2A. FIG. 2B may correspond to area B of FIG. 2A. FIG. 2C is vertical cross-sectional views of the semiconductor device illustrated in FIG. 2B taken along lines I-I' and II-II'. FIG. 2D is a vertical cross-sectional view of the semiconductor device illustrated in FIG. 2B taken along line III-III'. FIG. 2E is a vertical cross-sectional view of the semiconductor device illustrated in FIG. 2B, taken along line IV-IV'.

Referring to FIGS. 2A to 2E, the semiconductor device 100 according to various example embodiments includes a substrate 3, a gate structure GS, a buffer layer 21, a bit line structure BLS, a spacer structure SP, a contact plug 60, a landing pad 69, and a memory structure such as a memristor structure and/or a hysteresis structure and/or a capacitor structure 80.

The substrate 3 may include a semiconductor material, such as one or more of a group IV semiconductor, a group III-V compound semiconductor, or a group II-VI compound semiconductor. For example, the group IV semiconductor may include at least one of silicon, germanium or silicon-germanium. The substrate 3 may be or may include a silicon substrate, a silicon on insulator (SOI) substrate, a germanium substrate, a germanium on insulator (GOI) substrate, a silicon-germanium substrate, or a substrate including an epitaxial layer; however, example embodiments are not limited thereto.

The substrate 3 may include an active region 6*a*, a device isolation layer 6*s*, a first impurity region 9*a*, and a second impurity region 9*b*. The device isolation layer 6*s* may be or may include an insulating layer extending downward from the upper surface of the substrate 3 and may define the active region 6*a*. For example, the active region 6*a* may correspond to a portion of the upper surface of the substrate 3 surrounded by the device isolation layer 6*s*. In plan view, the active region 6*a* may have a bar shape having a minor axis and a major axis, and may extend in directions inclined to the X-direction and the Y-direction. An angle between a major axis of the active region 6*a* and the X-direction may be greater than 45 degrees, e.g., may be 50 degrees, 55 degrees, 60 degrees, 65 degrees, 70 degrees, 75 degrees, 80 degrees, or 85 degrees; however, example embodiments are not limited thereto.

The active region 6*a* may include first and second impurity regions 9*a* and 9*b* extending from the upper surface of the substrate 3 to a predetermined depth. The first and second impurity regions 9*a* and 9*b* may be spaced apart from each other. The first and second impurity regions 9*a* and 9*b* may serve as source/drain regions of the transistor. For example, for one active region 6*a*, two gate structures GS may cross the one active region 6*a*, and a drain region may be formed between the two gate structures GS. Source regions may be formed in regions opposite to the drain region with respect to the two gate structures GS. For example, the first impurity region 9*a* may correspond to the drain region, and the second impurity region 9*b* may correspond to the source region. The source region and the drain region are formed by first and second impurity regions 9*a* and 9*b* by doping and/or ion implantation of substantially the same impurities, e.g. concurrently doping and/or implanting the first and second impurity regions 9*a* and 9*b*, and may be referred to interchangeably depending on the circuit configuration of the finally formed transistor. The first and second impurity regions 9*a* and 9*b* may include impurities having a conductivity type opposite to a conductivity type of the substrate 3; however, example embodiments are not limited thereto. For example, the active regions 6*a* may include p-type impurities, and the first and second impurity regions 9*a* and 9*b* may include n-type impurities.

A depth of impurities in the first and second impurity regions 9*a* and 9*b* may be the same as each other, or may be different from each other. In some example embodiments, either or both of the first and second impurity regions 9*a* and 9*b* may include carbon; however, example embodiments are not limited thereto. In some example embodiments, either or both of the first and second impurity regions 9*a* and 9*b* may include impurities of a first conductivity type at a first concentration, and may also impurities of a second conductivity type at a second concentration lower than, e.g., much lower than, the first concentration.

The device isolation layer 6*s* may extend downward from the upper surface of the substrate 3 and may define active regions 6*a*. The device isolation layer 6*s* may surround and separate the active regions 6*a* from each other. The device isolation layer 6*s* may include silicon oxide, silicon nitride, silicon oxynitride, or combinations thereof, and may be formed of a single layer or a plurality of layers.

Figure 3A:
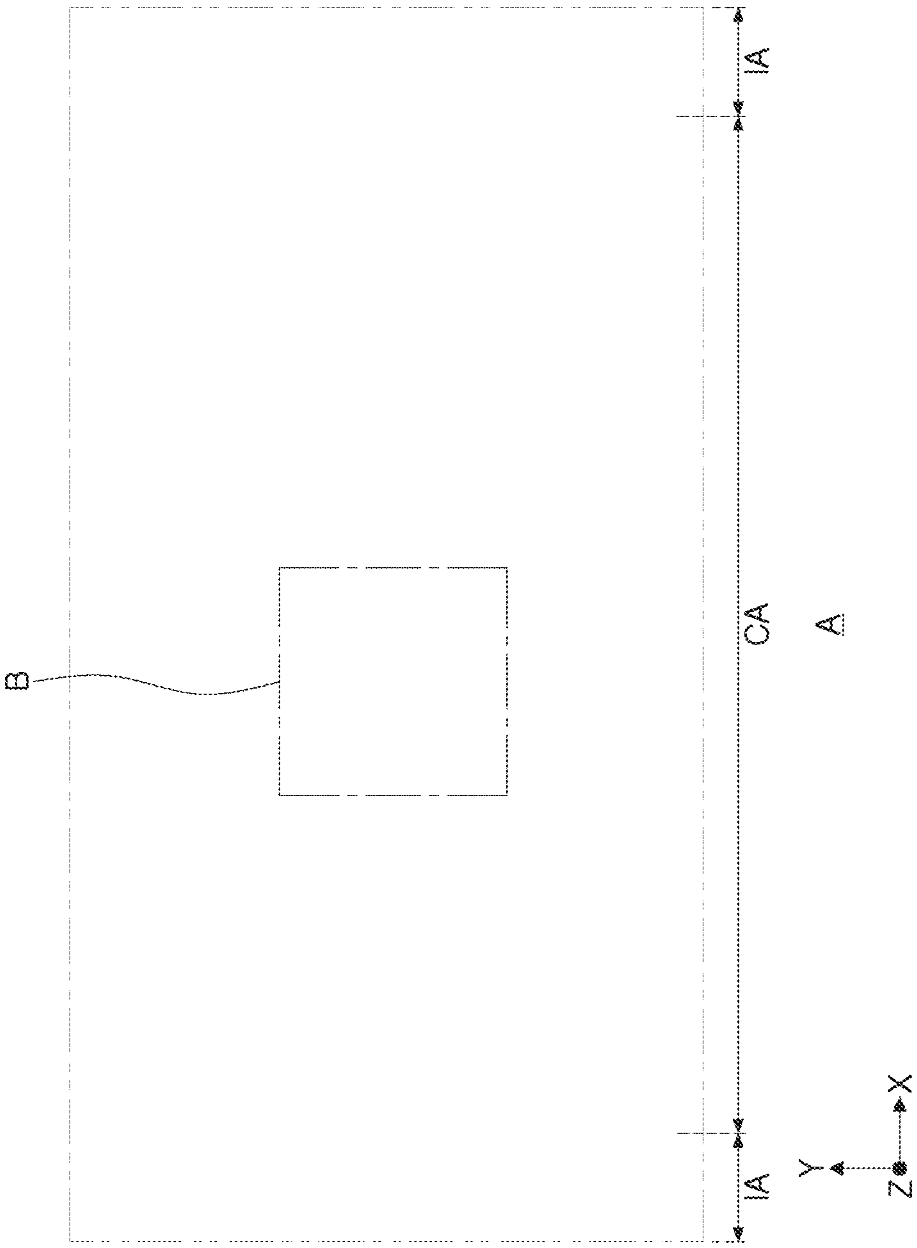
FIGS. 3A to 10D are plan views and vertical cross-sectional views illustrating a method of manufacturing a semiconductor device according to some example embodiments according to a process sequence.
Figure 3B:
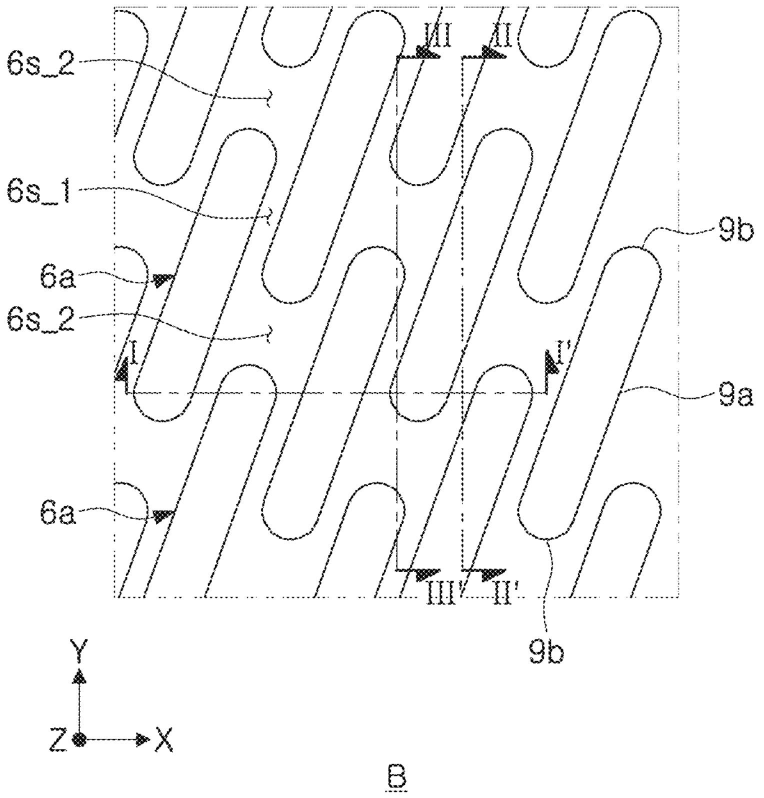

In some example embodiments, the device isolation layer 6*s* may include a first region 6*s*_1 and a second region 6*s*_2 lower than the first region 6*s*_1 (see FIG. 3B). When viewed from a plan view, the first region 6*s*_1 may correspond to a space between adjacent active regions 6*a* in the X-direction, and the second region 6*s*_2 may correspond to a space surrounded by four adjacent active regions 6*a*. FIG. 2C illustrates the first region 6*s*_1 of the device isolation layer 6*s*, and FIG. 2D illustrates the first region 6*s*_1 and the second region 6*s*_2 of the device isolation layer 6*s*. The horizontal width of the first region 6*s*_1 in the X-direction may be smaller than the horizontal width of the second region 6*s*_2 in the X-direction.

In plan view, the gate structures GS may extend in the X-direction and may be spaced apart from each other in the Y-direction orthogonal t the X-direction. In some example embodiments, the gate structures GS may include first gate structures GS1 and second gate structures GS2 alternately disposed or alternatively arranged in the Y-direction. The second gate structure GS2 may have the same or similar structure as the first gate structure GS1. The gate structures GS may cross the active region 6*a*. For example, one first gate structure GS1 and one second gate structure GS2 may cross in one active region 6*a*. Transistors respectively including the gate structure GS and the first and second impurity regions 9*a* and 9*b* may constitute or be included in a buried channel array transistor (BCAT), but example embodiments are not limited thereto.

In plan view, the first gate structures GS1 and the second gate structures GS2 may be disposed in a zigzag pattern. For example, both ends of the first gate structure GS1 spaced apart from each other in the X-direction may be disposed in a zigzag pattern with both ends of each second gate structure GS2 spaced apart from each other in the X-direction. In some example embodiments, a cross-sectional area of the first gate structure GS1 may be different from a cross-sectional area of the second gate structure GS2. For example, the length of the first gate structure GS1 in the X-direction may be greater than the length of the second gate structure GS2 in the Y-direction. The center of the first gate structure GS1 in the X-direction may be aligned with the center of the second gate structure GS2 in the X-direction.

The semiconductor device 100 may further include gate contacts C1 and C2 (referring to FIG. 2A) electrically connected to the gate structures GS. The gate contacts C1 and C2 may include a first gate contact C1 connected to and vertically overlapping the first gate structure GS1, and a second gate contact C2 connected to and overlapping the second gate structure GS2 in the vertical direction. The first gate contact C1 and the second gate contact C2 may be disposed on one (or at least one of) of first and second or both ends of the first gate structure GS1 and one of (or at least one of) first and second or both ends of the second gate structure GS2 in the X-direction, respectively, and may be disposed within the interface area IA. For example, the first gate contacts C1 may be aligned in the Y-direction, and the second gate contacts C2 may be aligned in the Y-direction. The first gate contacts C1 and the second gate contacts C2 may be arranged in a zigzag pattern or alternating pattern in the Y-direction. The pitch of the first gate contacts C1 and the pitch of the second gate contacts C2 may be twice the pitch of the gate structures GS. Since the gate structures GS according to various example embodiments are disposed in a zigzag pattern or alternating pattern or dovetailed pattern, electrical influence between the gate structures GS and the gate contacts C1 and C2 may be reduced. For example, the first gate contact C1 may not overlap the second gate structure GS2 in the Y-direction. For example, the first gate contact C1 may be disposed farther from the cell area CA than an end of the adjacent second gate structure GS2.

In the cross-sectional view, the gate structures GS may be buried in (e.g., wholly or at least partly buried in) the substrate 3. For example, the first gate structure GS1 and the second gate structure GS2 may be disposed inside the first gate trench T1 and the second gate trench T2 formed in the substrate 3, respectively. The gate structure GS may include a gate dielectric layer 14, a gate electrode 16, and a gate capping layer 18 disposed inside the gate trenches T1 and T2. The gate dielectric layer 14 may be formed or conformally formed or arranged on inner walls of the first gate trench T1 and the second gate trench T2. The gate electrode 16 may be disposed on a lower portion of the first gate trench T1 and the second gate trench T2, and the gate capping layer 18 may be disposed on an upper portion of the gate structure GS and may fill the gate trenches T1 and T2. An upper surface of the gate capping layer 18 may be coplanar with an upper surface of the device isolation layer 6*s*.

In some example embodiments, the depth of the gate structure GS may not be constant. For example, as illustrated in FIG. 2E, the lower surface of the first gate structure GS1 may include a first portion GS1_L1, a second portion GS1_L2, and a third portion GS1_L3. The first portion GS1_L1 may contact the first region 6*s*_1 of the device isolation layer 6*s*, and the second portion GS1_L2 may contact the second region 6*s*_2 of the device isolation layer 6*s*. The third portion GS1_L3 may contact the active region 6*a*. The second portion GS1_L2 may be located at a lower level than or below a level of the first portion GS1_L1, and the third portion GS1_L3 may be located at a higher level than the first portion GS1_L1. Although not illustrated, the depth of the second gate structure GS2 may not be constant, and the second gate structure GS2 may have the same or similar structure as the first gate structure GS1.

The gate dielectric layer 14 may include silicon oxide and/or or a material having a high dielectric constant. In some example embodiments, the gate dielectric layer 14 may be a layer formed by oxidation of or thermal oxidation of the active region 6*a* or a layer formed by deposition. The gate electrode 16 may include a conductive material, for example, at least one of polycrystalline silicon (Si), titanium (Ti), titanium nitride (TiN), tantalum (Ta), tantalum nitride (TaN), tungsten (W), tungsten nitride (WN), and aluminum (Al). The gate capping layer 18 may include silicon nitride.

The buffer layer 21 may be disposed on the active region 6*a*, the device isolation layer 6*s*, and the gate structure GS. The buffer layer 21 may include silicon oxide, silicon nitride, silicon oxynitride, or combinations thereof. The buffer layer 21 may be formed of a single layer or multiple layers.

The bit line structures BLS may extend in the Y-direction and may be spaced apart from each other in the X-direction. The bit line structure BLS may have a bar shape extending in the Y-direction. The bit line structure BLS may include a bit line BL and a bit line capping layer 28 on the bit line BL. The bit line BL may include a first conductive layer 25*a*, a second conductive layer 25*b*, and a third conductive layer 25*c* sequentially stacked on the buffer layer 21. The first conductive layer 25*a* may include polysilicon such as doped polysilicon. The second conductive layer 25*b* may include a metal-semiconductor compound. The metal-semiconductor compound may be, for example, a layer obtained by silicidizing at least a portion of the first conductive layer 25*a*. For example, the metal-semiconductor compound may include one or more of cobalt silicide (CoSi), titanium silicide (TiSi), nickel silicide (NiSi), tungsten silicide (WSi), or other metal silicides, or may include nitrides such as TiSiN. The third conductive layer 25*c* may include a metal material such as one or more of titanium (Ti), tantalum (Ta), tungsten (W), or aluminum (Al). The bit line BL may further include a plug portion 25*p* disposed below the first conductive layer 25*a* and extending downward to contact the second impurity region 9*b*. The plug portion 25*p* may be located in a contact hole H formed in the upper surface of the substrate 3. In plan view, the plug portion 25*p* may contact the central portion of the active region 6*a*. The plug portion 25*p* may electrically connect the active region 6*a* to the bit line structure BLS. The plug portion 25*p* may include the same material as the first conductive layer 25*a*.

The bit line capping layer 28 may include a first insulating layer 28*a*, a second insulating layer 28*b*, and a third insulating layer 28*c* disposed on the bit line BL. Side surfaces of the first insulating layer 28*a* may be coplanar with the first conductive layer 25*a*, the second conductive layer 25*b*, and the third conductive layer 25*c*. The first insulating layer 28*a*, the second insulating layer 28*b*, and the third insulating layer 28*c* may include silicon oxide, silicon nitride, silicon oxynitride, or combinations thereof, and for example, may include silicon nitride.

The spacer structures SP may be disposed on first and second sides, e.g., on both side surfaces of the bit line structures BLS, respectively, and may extend in the Y-direction along the side surfaces of the bit line structures BLS. The spacer structure SP may include a number of spacers, such as a first spacer SP1, a second spacer SP2, a third spacer SP3, and a fourth spacer SP4 disposed on side surfaces of the bit line structures BLS. The first spacer SP1 may be conformally disposed along side surfaces of the bit line structure BLS and the contact hole H. The second spacer SP2 is disposed on the first spacer SP1 and may fill the contact hole H. The third spacer SP3 may cover the side surface of the first spacer SP1, and the fourth spacer SP4 may cover the side surface of the third spacer SP3. The third spacer SP3 and the fourth spacer SP4 may cover the upper surface of the second spacer SP2. The first spacer SP1, the second spacer SP2, the third spacer SP3, and the fourth spacer SP4 may include silicon oxide, silicon nitride, silicon oxynitride, or combinations thereof. The spacer structure SP of various embodiments is an illustrative example, and the material and/or the number of layers are not limited thereto and may be variously changed.

The contact plug 60 is disposed between the bit line structures BLS and may contact the spacer structures SP. The contact plugs 60 may be disposed between the bit line structures BLS and between the gate structures GS.

The lower end of the contact plug 60 may be located at a level lower than the upper surface of the substrate 3, and the upper surface of the contact plug 60 may be located at a level lower than or below the upper surface of the bit line structure BLS. The contact plug 60 may extend into the substrate 3 to contact the second impurity region 9*b* of the active region 6*a* and may be electrically connected to the second impurity region 9*b*. The contact plug 60 may be formed of a conductive material, and for example, may include at least one of polysilicon (Si) such as doped polysilicon, titanium (Ti), titanium nitride (TiN), tantalum (Ta), tantalum nitride (TaN), tungsten (W), tungsten nitride (WN), and aluminum (Al). In some example embodiments, the contact plug 60 may include doped polysilicon and may include n-type impurities such as one or more of phosphorus (P), arsenic (As), and antimony (Sb).

A fence structure 63 may be disposed between the bit line structures BLS and may overlap the gate structure GS in a vertical direction. The fence structures 63 may be alternately disposed with the contact plugs 60 in the Y-direction. The fence structures 63 may spatially separate the contact plugs 60 from each other and electrically insulate the same from each other. A lower surface of the fence structure 63 may contact the gate capping layer 18 of the gate structure GS. In some example embodiments, the lower surface of the fence structure 63 may have a curved surface that is convex downward toward the gate capping layer 18, and the upper surface of the gate capping layer 18 may have a curved surface that is concave upward. The lower surface of the fence structure 63 may be located at a lower level than the upper surface of the substrate 3. The fence structure 63 may include an insulating material, for example, silicon nitride.

The semiconductor device 100 may further include a metal-semiconductor compound layer 66 disposed on the upper surface of the contact plug 60. The metal-semiconductor compound layer 66 may contact the side surface of the spacer structure SP and the side surface of the fence structure 63.

The landing pad 69 may be disposed on the metal-semiconductor compound layer 66, and may include a barrier layer 69*a* covering the bit line structure BLS, the spacer structure SP and the fence structure 63, and a metal layer 69*b* on the barrier layer 69*a*. The landing pad 69 may be electrically connected to the second impurity region 9*b* of the active region 6*a* through the contact plug 60. The metal-semiconductor compound layer 66 may include one or more of cobalt silicide (CoSi), titanium silicide (TiSi), nickel silicide (NiSi), tungsten silicide (WSi), or other metal silicide. The barrier layer 69*a* may include a metal nitride, for example, at least one of titanium nitride (TiN), tantalum nitride (TaN), and tungsten nitride (WN). The metal layer 69*b* may include a conductive material, for example, at least one of titanium (Ti), tantalum (Ta), tungsten (W), and aluminum (Al).

The semiconductor device 100 may further include an upper insulating spacer 50 covering upper portions of the bit line structure BLS, the spacer structure SP, and the fence structure 63. The upper insulating spacer 50 may be disposed between the bit line structure BLS and the barrier layer 69*a*, between the spacer structure SP and the barrier layer 69*a*, and between the fence structure 63 and the barrier layer 69*a*.

The semiconductor device 100 may further include an insulating pattern 72 disposed between the landing pads 69. An upper surface of the insulating pattern 72 may be coplanar with an upper surface of the landing pad 69, and the insulating pattern 72 may extend downward to partially contact the bit line structures BLS. The insulating pattern 72 may spatially separate the landing pads 69 from each other and electrically insulate the same from each other.

The semiconductor device 100 may further include an etch stop layer 75 covering upper surfaces of the landing pad 69 and the insulating pattern 72. The capacitor structure 80 may be disposed on the landing pad 69 and the insulating pattern 72. The capacitor structure 80 may include a lower electrode 82, a capacitor dielectric layer 84 and an upper electrode 86. The lower electrode 82 may pass through the etch stop layer 75 and contact the upper surface of the landing pad 69. The capacitor dielectric layer 84 may cover the lower electrode 82 and the etch stop layer 75, and the upper electrode 86 may cover the capacitor dielectric layer 84. The capacitor structure 80 may be electrically connected to the landing pad 69 and the contact plug 60. The lower electrode 82 and the upper electrode 86 may include at least one of a doped semiconductor, a metal nitride, a metal, and a metal oxide. The lower electrode 82 and the upper electrode 86 may include, for example, at least one of polycrystalline silicon, titanium nitride (TiN), tungsten (W), titanium (Ti), ruthenium (Ru), and tungsten nitride (WN). The capacitor dielectric layer 84 may include at least one of high dielectric constant materials, for example, such as zirconium oxide ($ZrO_2$), aluminum oxide ($Al_2O_3$), and hafnium oxide ($Hf_2O_3$). Alternatively or additionally, the capacitor structure 80 may have ferromagnetic properties; however, example embodiments are not limited thereto.

FIGS. 3A to 10D are plan views and vertical cross-sectional views illustrating a method of manufacturing a semiconductor device according to some example embodiments according to a process sequence. In detail, FIGS. 3A, 4A, 5A, 6A, 7A, 8A, 9A, and 10A are plan views corresponding to FIG. 2A. FIGS. 3B, 4B, 5B, 6B, 7B, 8B, 9B and 10B are plan views corresponding to area B of FIGS. 3A, 4A, 5A, 6A, 7A, 8A, 9A and 10A, respectively. FIGS. 3C, 4C, 5C, 6C, 7C, 8C, 9C and 10C are vertical cross-sections taken along lines I-I' and II-II' in FIGS. 3B, 4B, 5B, 6B, 7B, 8B, 9B and 10B, respectively. FIGS. 3D, 4D, 5D, 6D, 7D, 8D, 9D and 10D are vertical cross-sectional views taken along line III-III' in FIGS. 3B, 4B, 5B, 6B, 7B, 8B, 9B and 10B, respectively.

Referring to FIGS. 3A to 3D, the device isolation layer 6*s* may be formed in or within the substrate 3. The substrate 3 may include a cell area CA and an interface area IA. The interface area IA may wholly or at least partially surround the cell area CA, and as illustrated in FIG. 1, the interface area IA may be disposed between the cell area CA and the peripheral circuit area PA.

The device isolation layer 6*s* may be disposed in the cell area CA of the substrate 3. The device isolation layer 6*s* may be formed by forming a trench in the upper surface of the substrate 3, filling the trench with an insulating material, and performing a planarization process of etching and/or polishing the substrate 3 and the insulating material. The device isolation layer 6*s* may define the active regions 6*a*. For example, the active regions 6*a* may correspond to portions of the upper surface of the substrate 3 surrounded by the device isolation layer 6*s*. In plan view, the active regions 6*a* may have a bar shape having a minor axis and a major axis, and may be spaced apart from each other. The device isolation layer 6*s* may be comprised of a single layer or a plurality of layers.

Figure 3C:
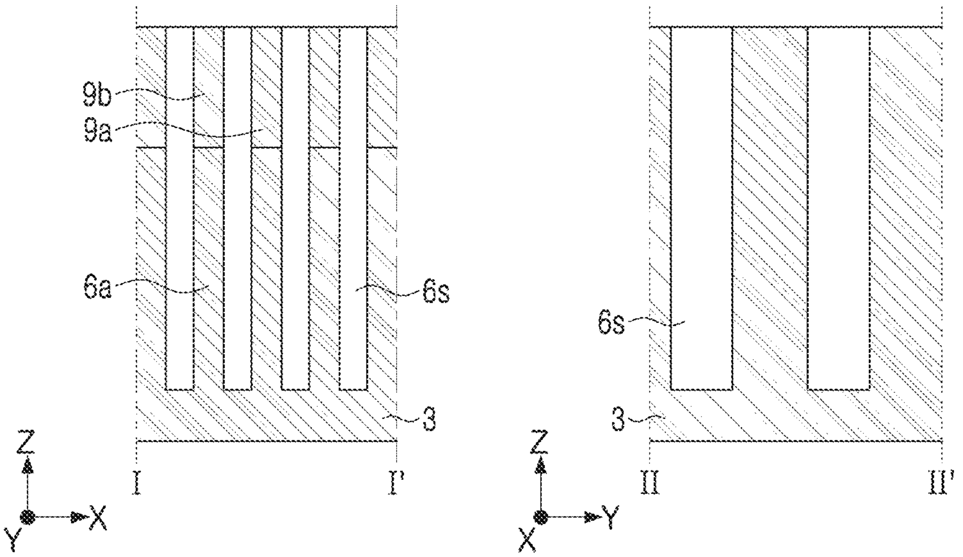
Figure 3D:
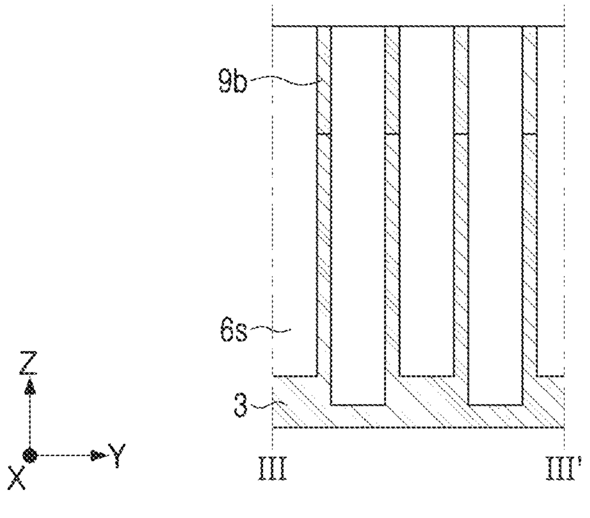
Figure 4A:
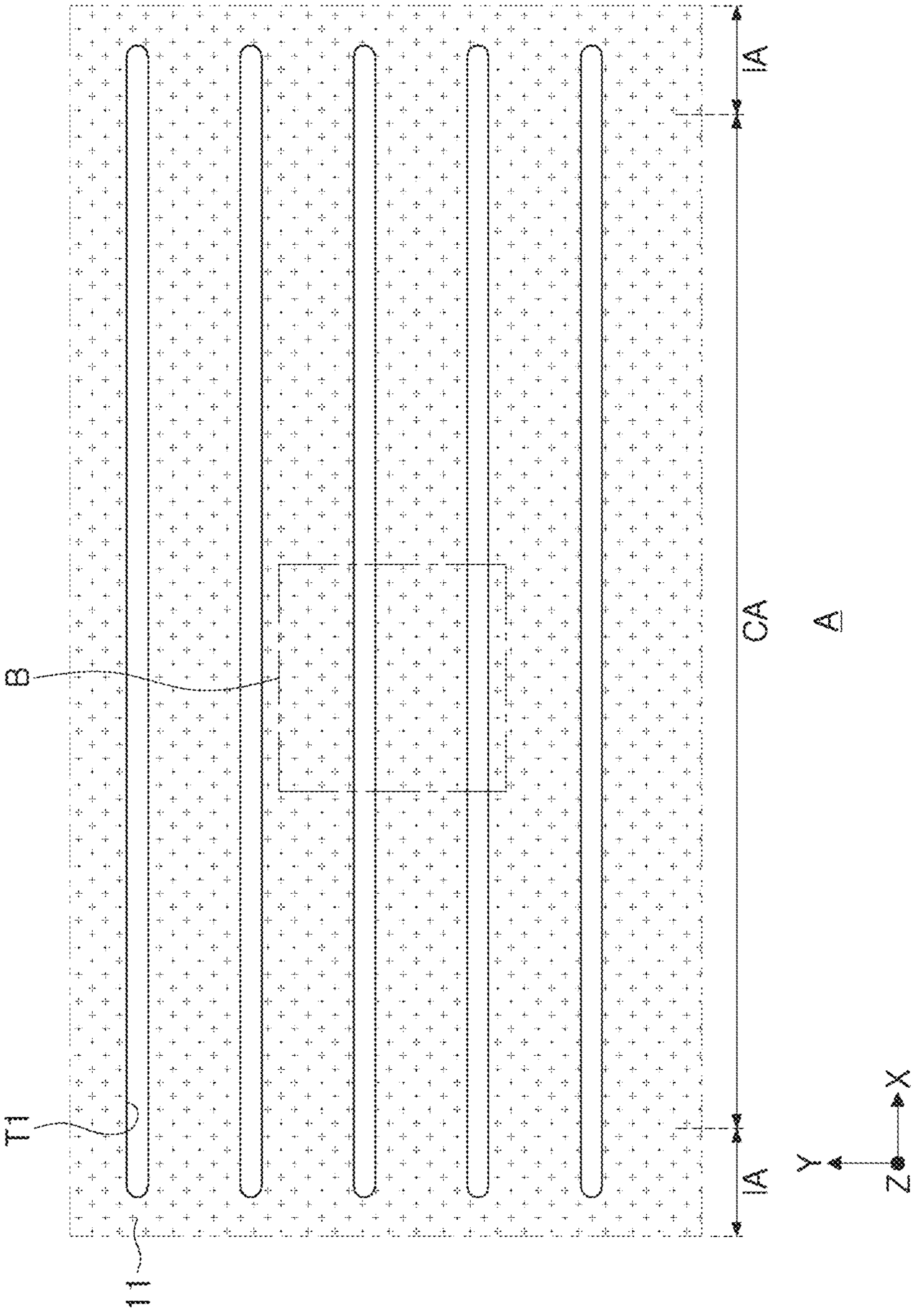
Figure 4B:
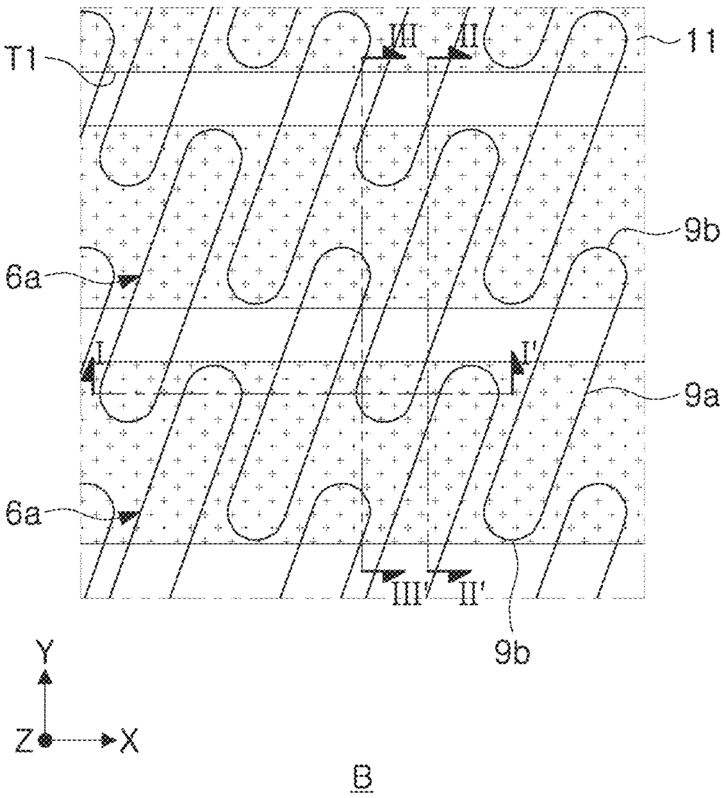
Figure 4C:
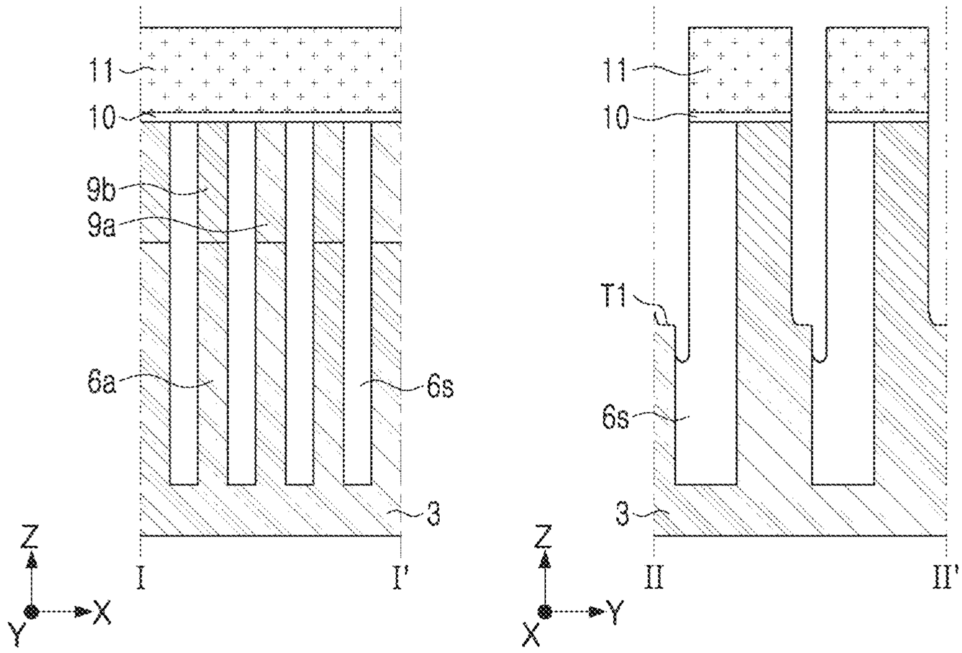
Figure 4D:
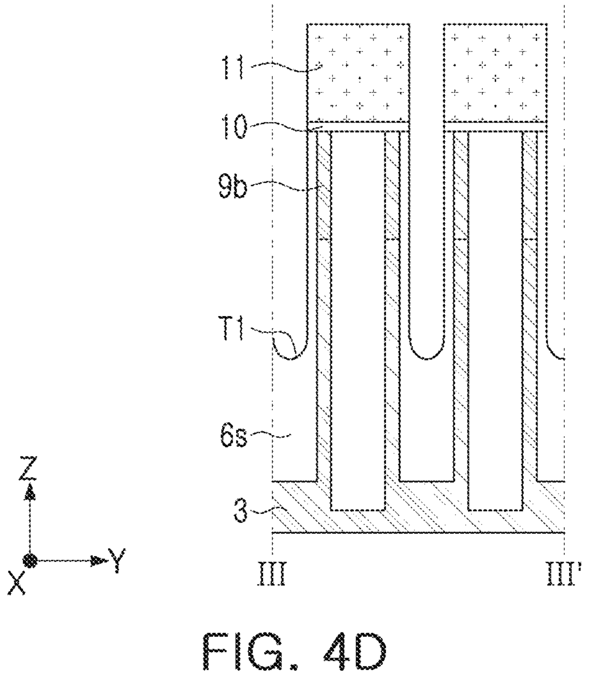
Figure 5A:
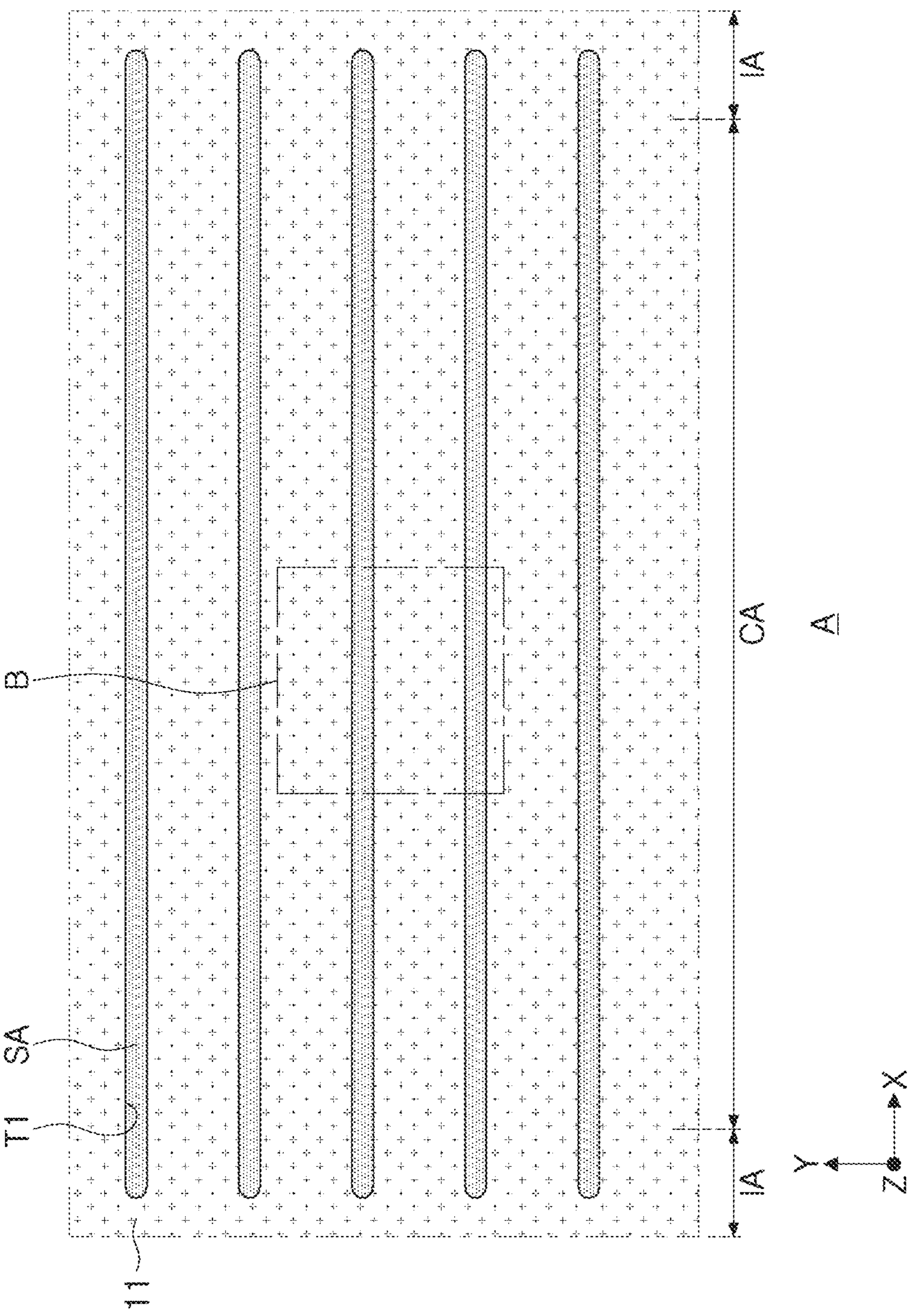
Figure 5B:
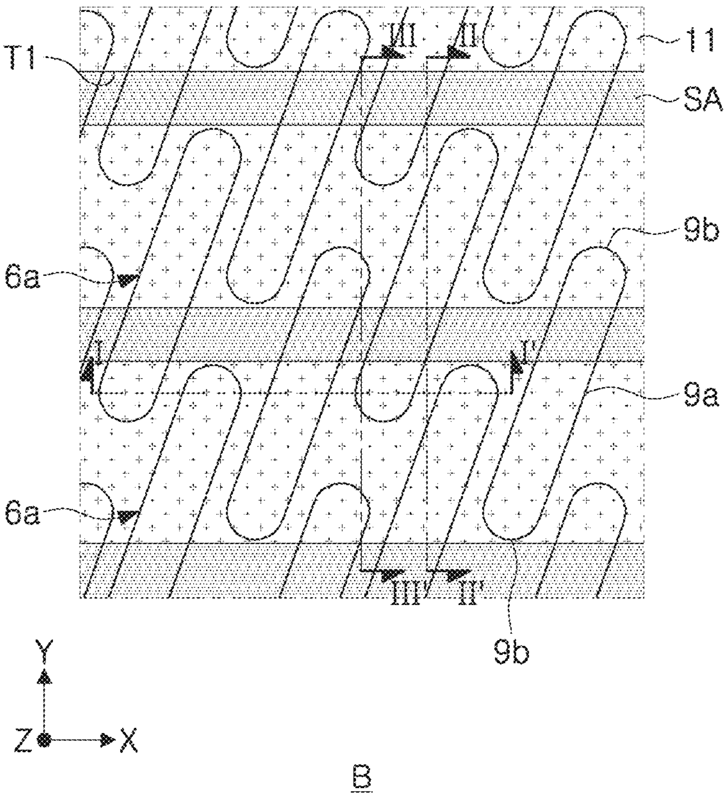
Figure 5C:
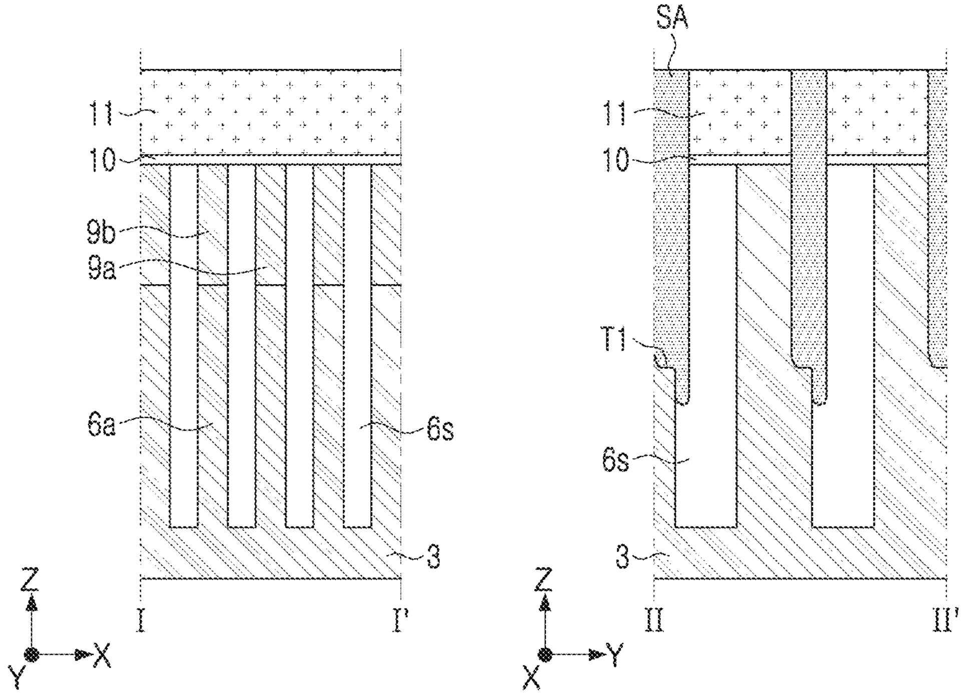
Figure 5D:
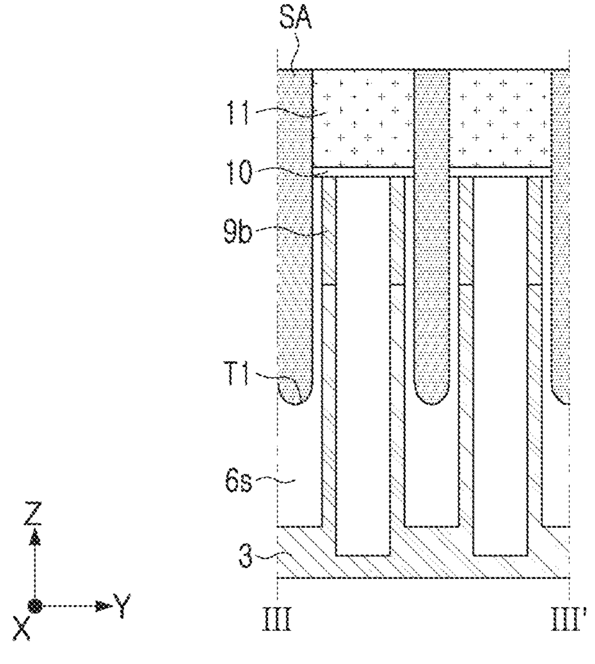
Figure 6A:
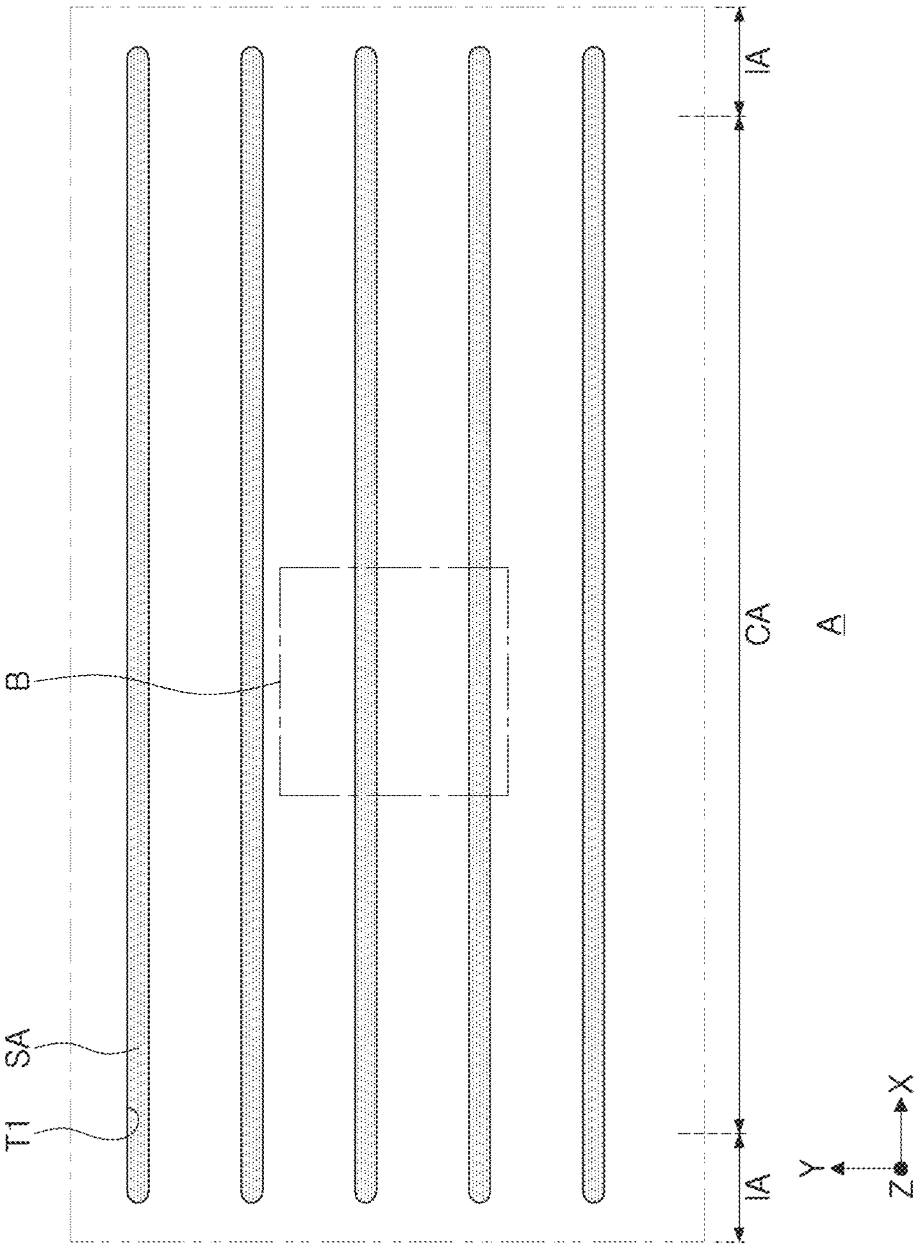
Figure 6B:
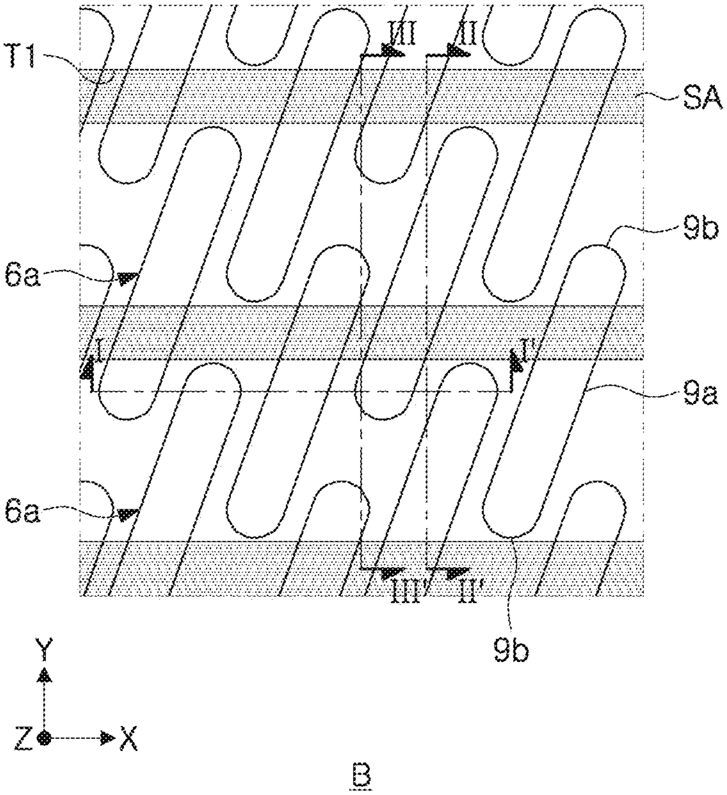
Figure 6C:
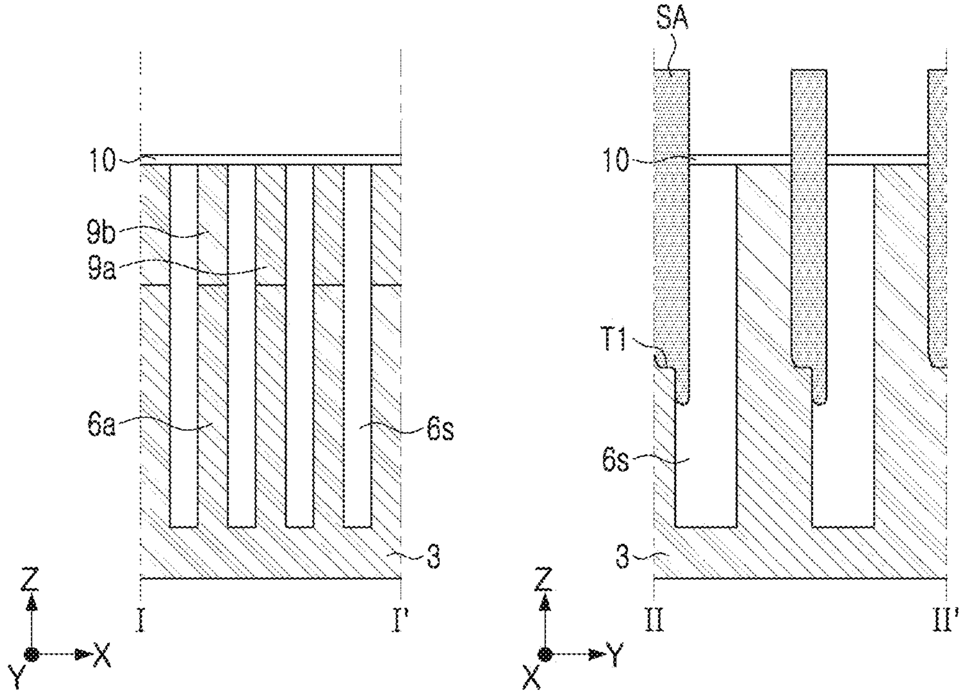
Figure 6D:
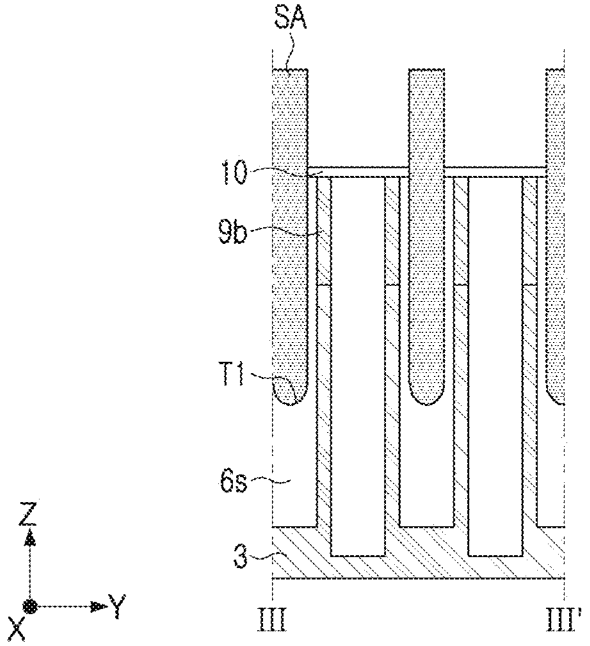
Figure 7A:
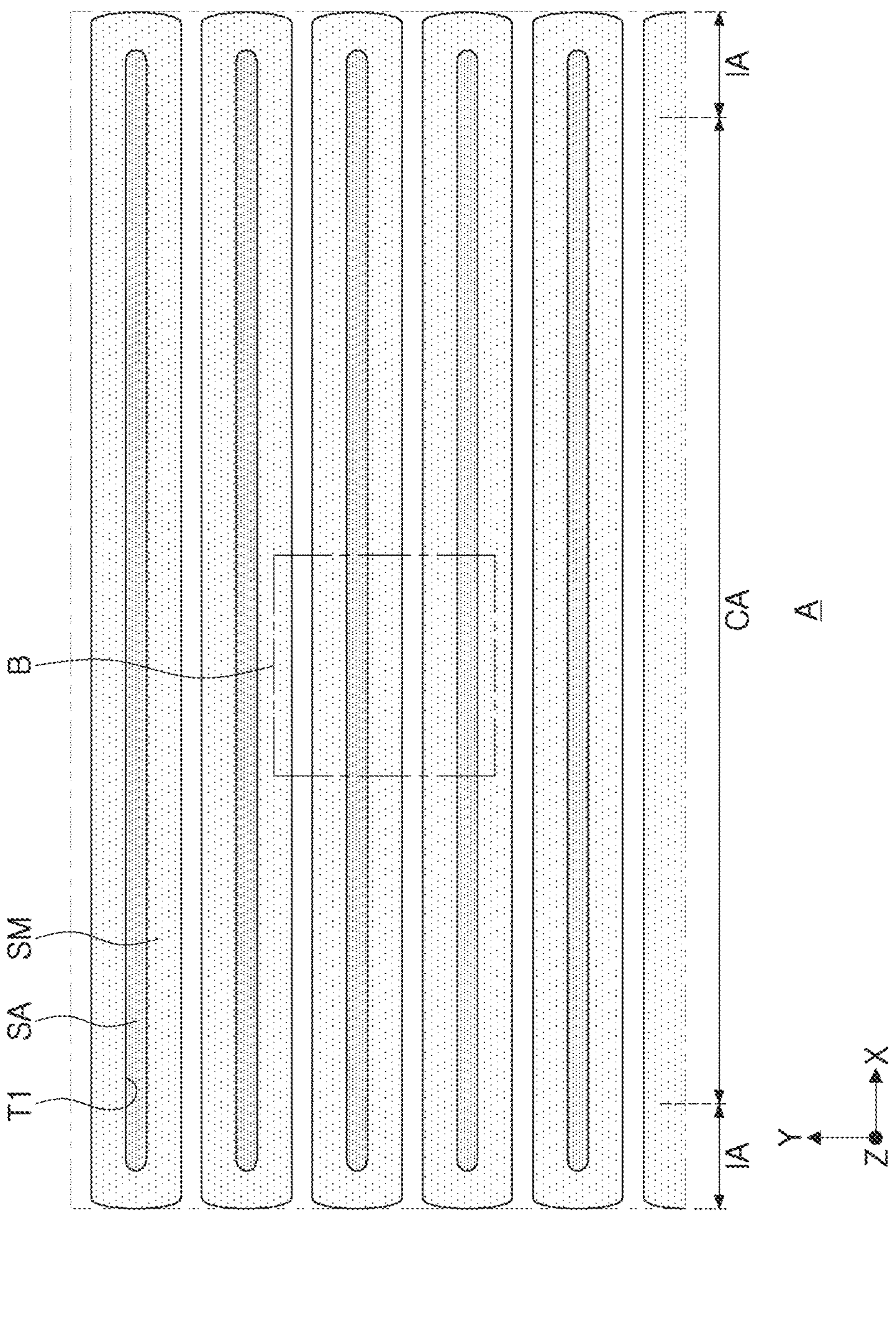
Figure 7B:
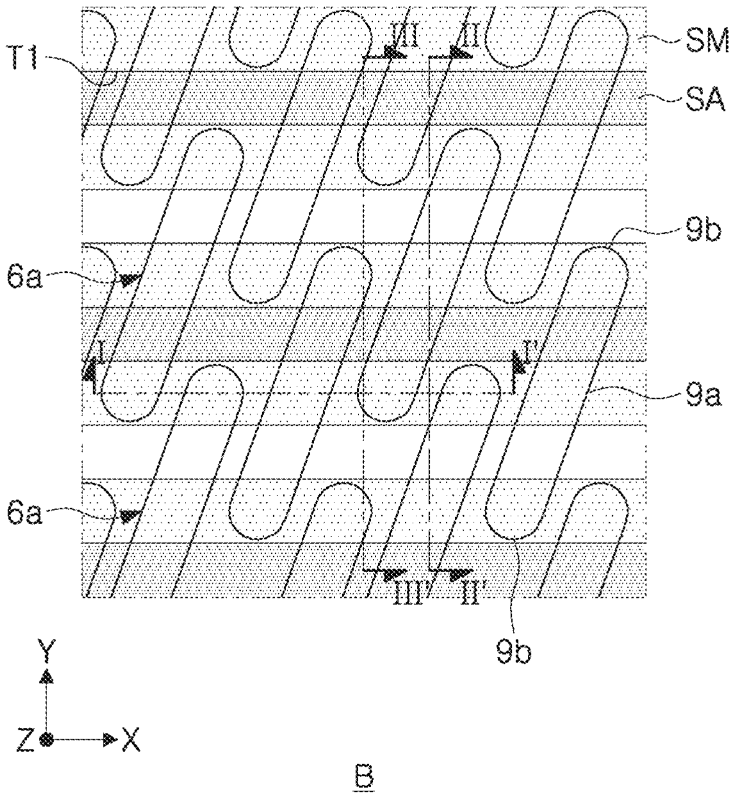
Figure 7C:
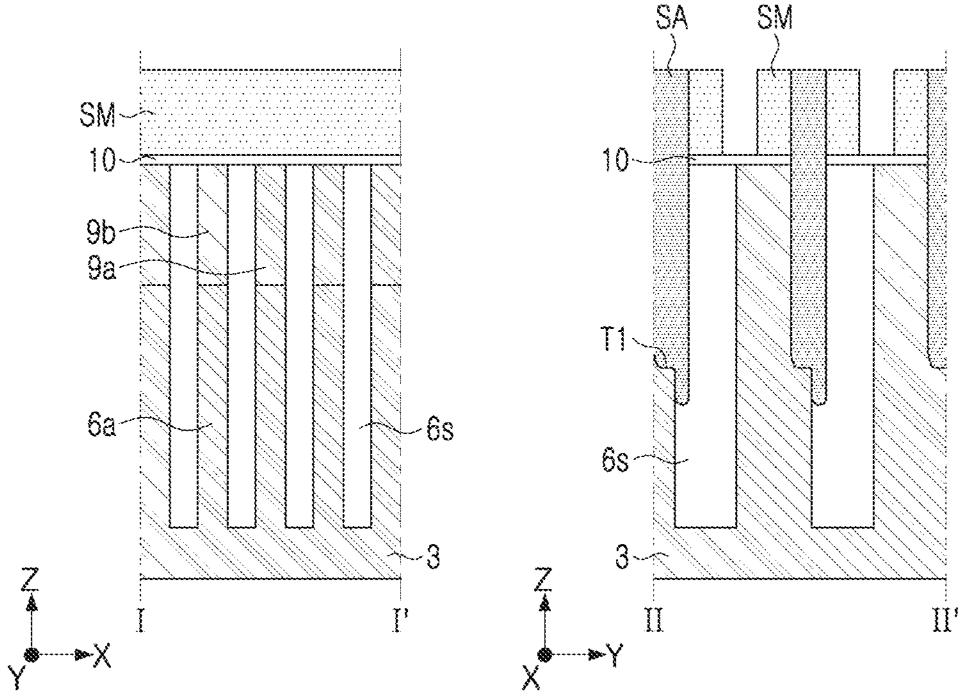
Figure 7D:
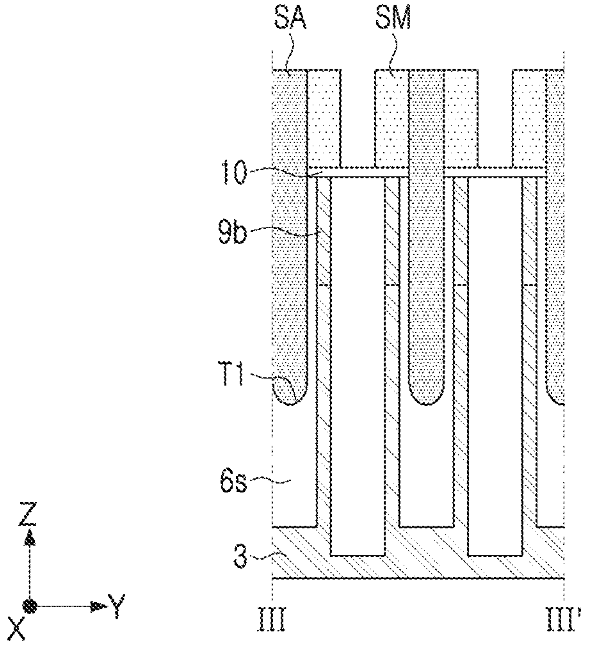
Figure 8A:
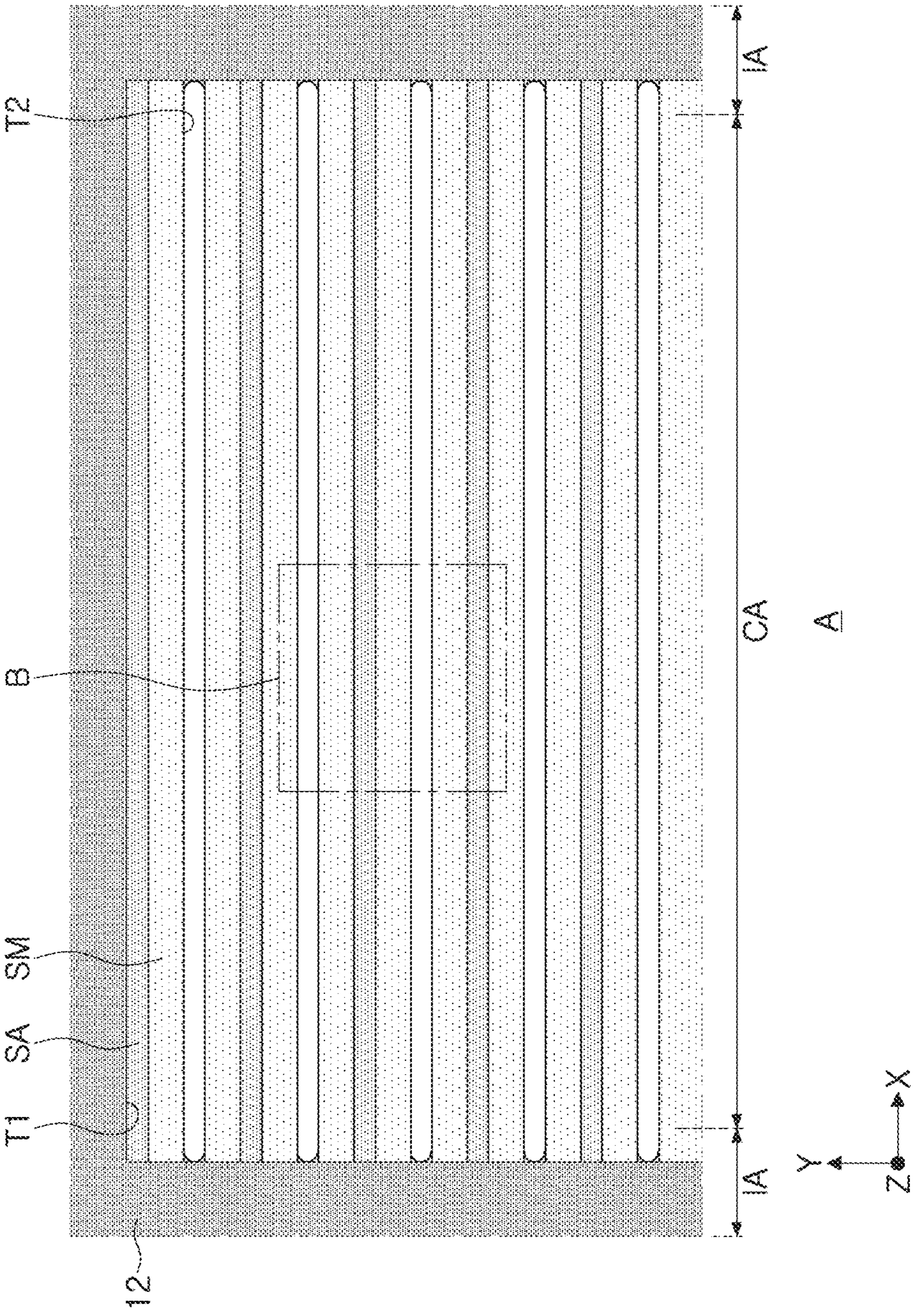
Figure 8B:
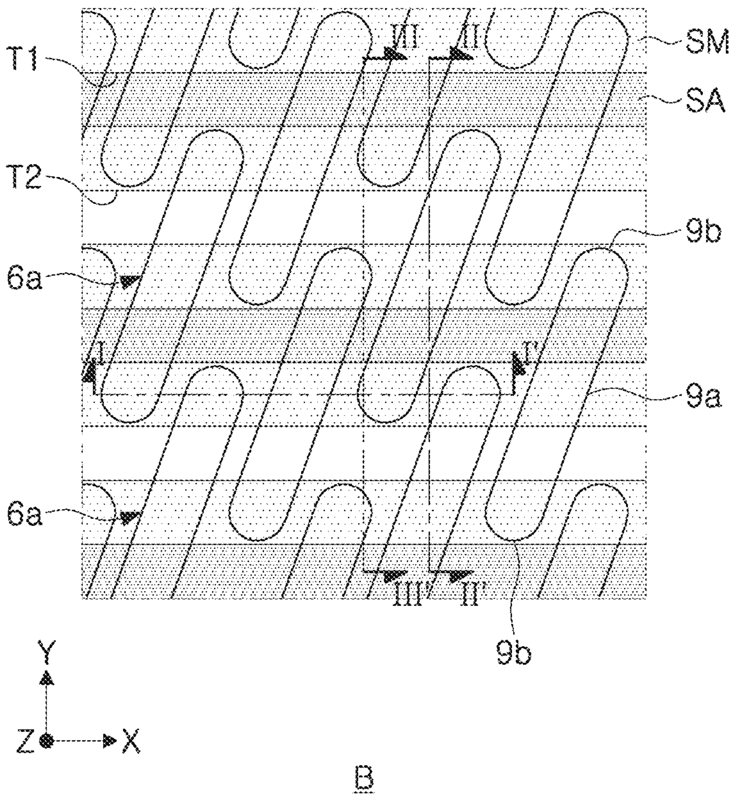
Figure 8C:
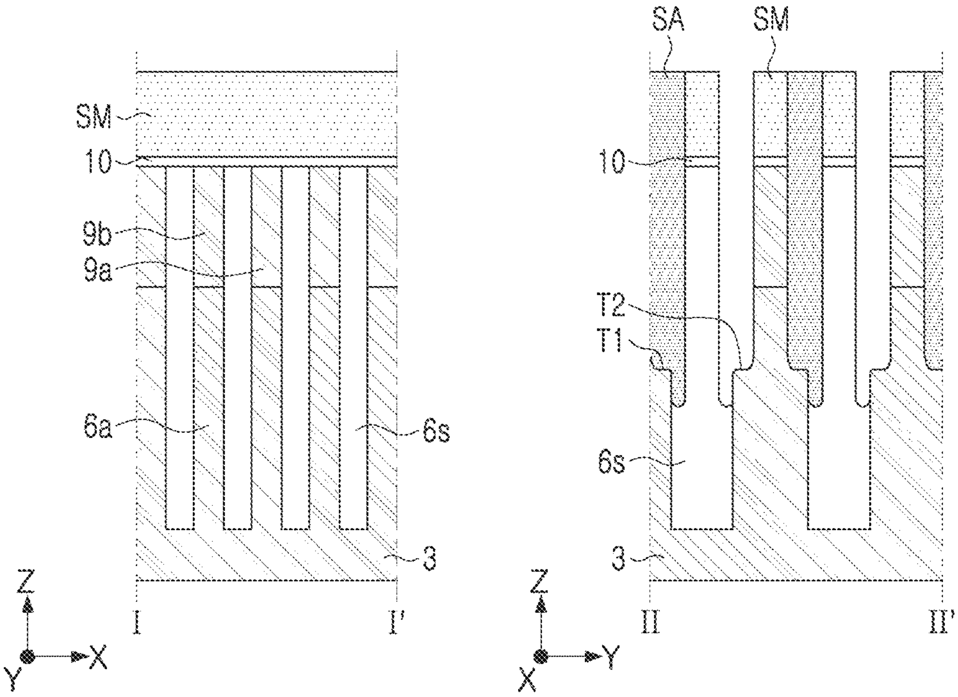
Figure 8D:
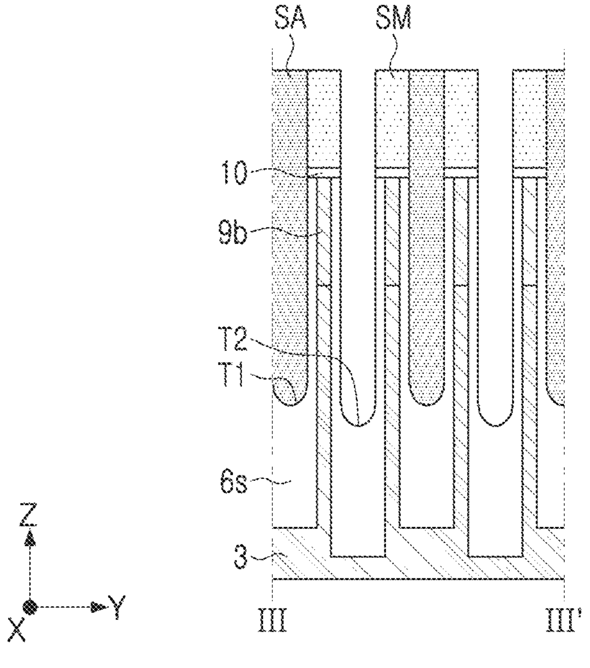
Figure 9A:
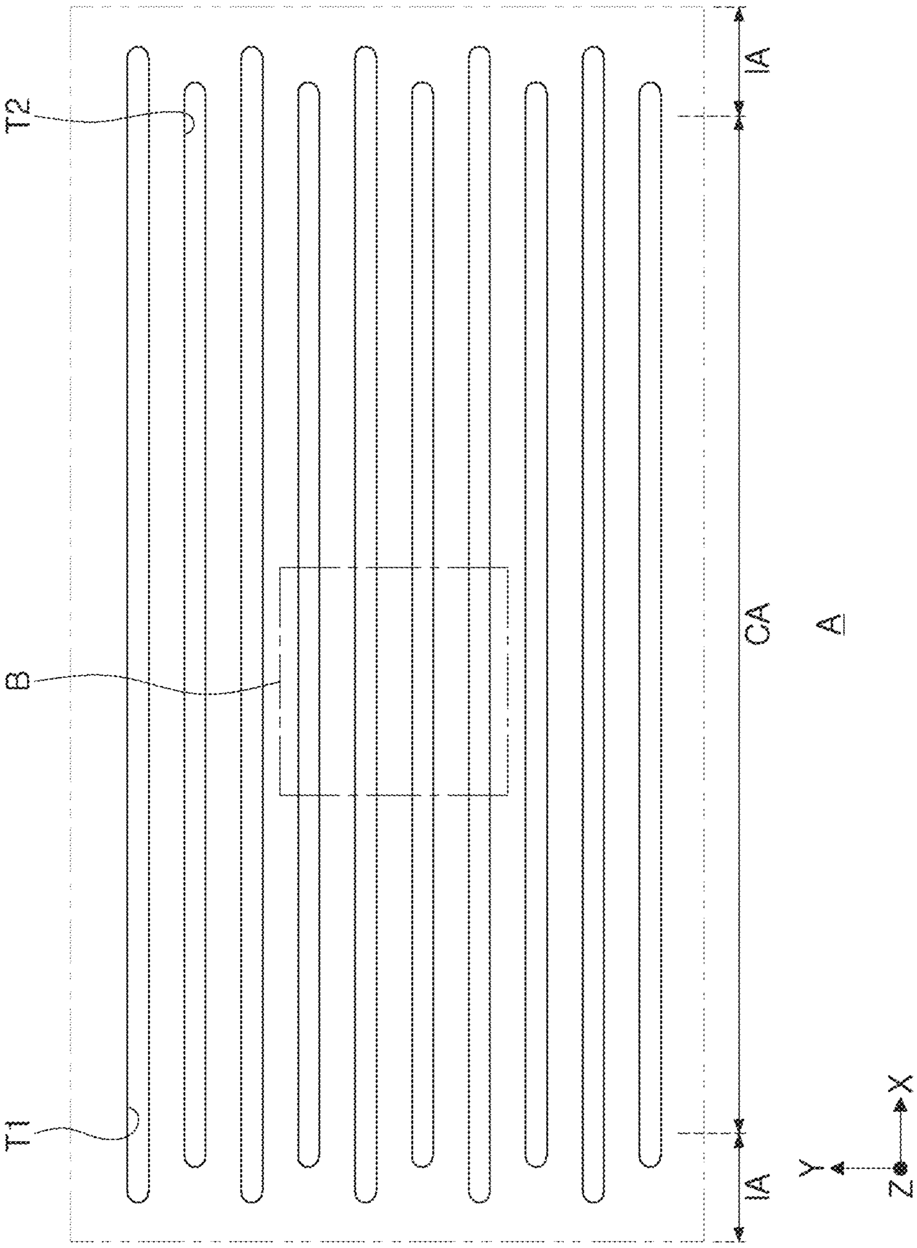
Figure 9B:
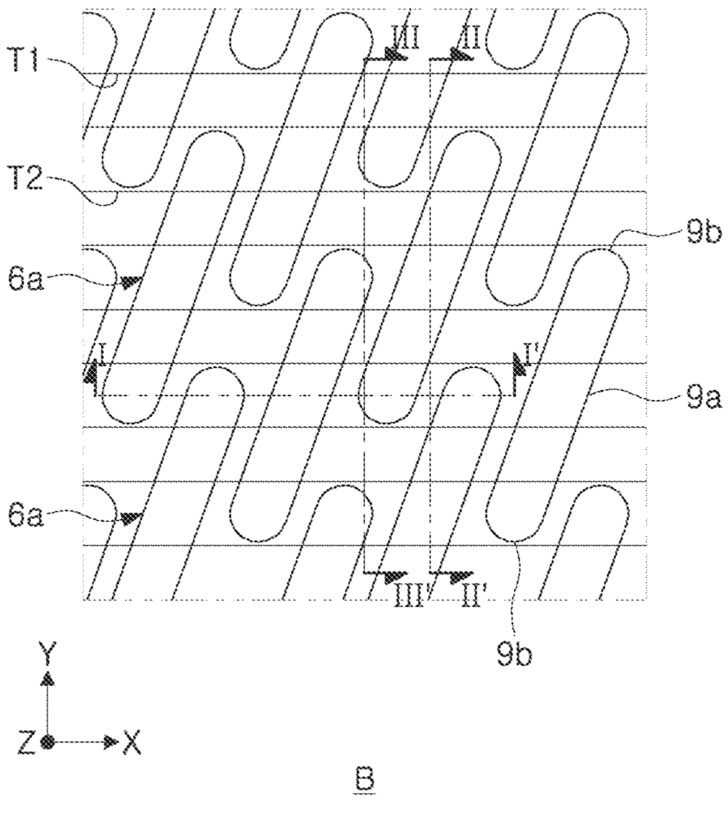
Figure 9C:
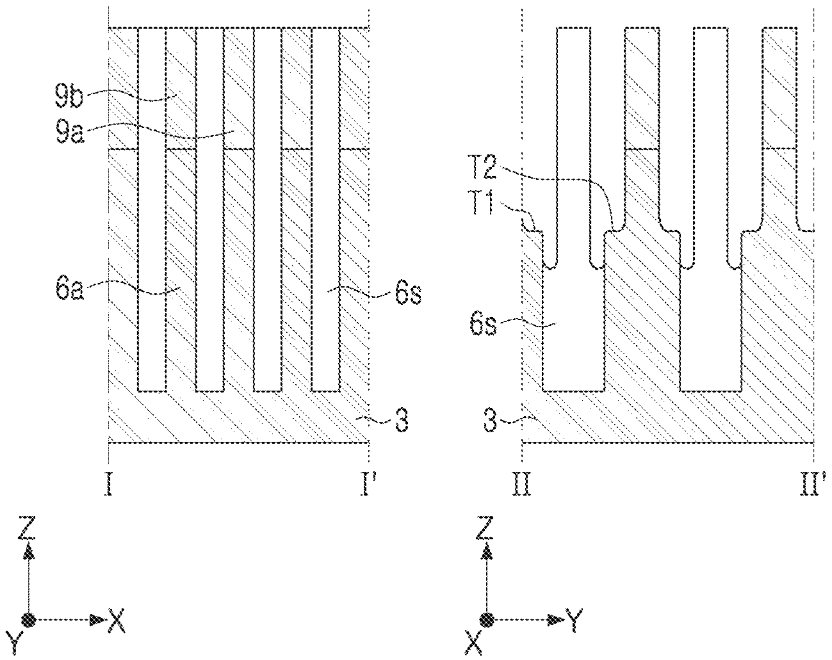
Figure 9D:
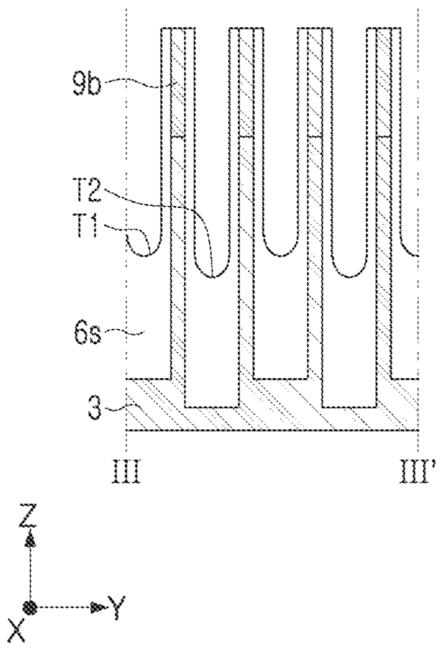
Figure 10A:
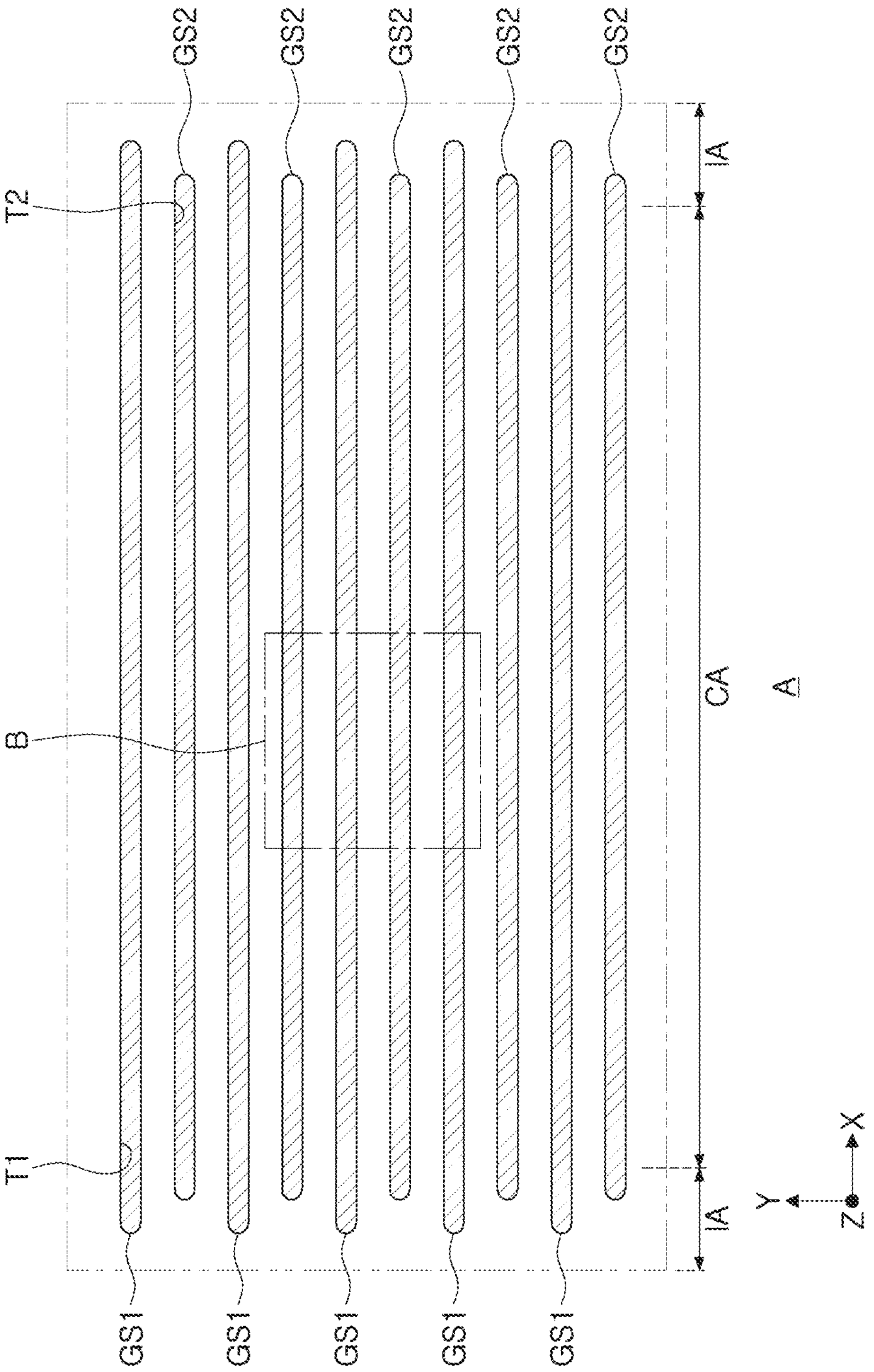
Figure 10B:
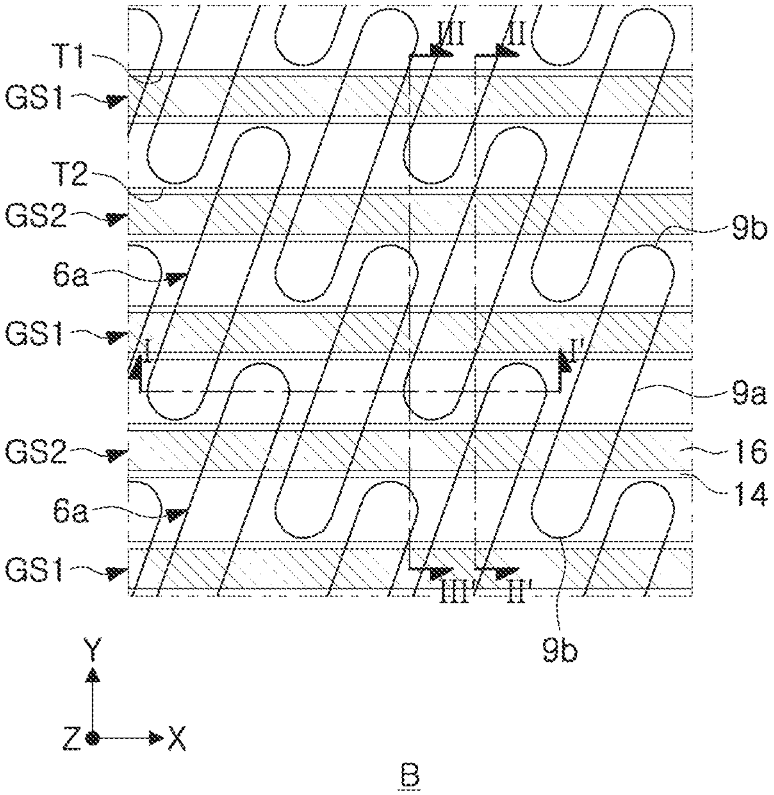
Figure 10C:
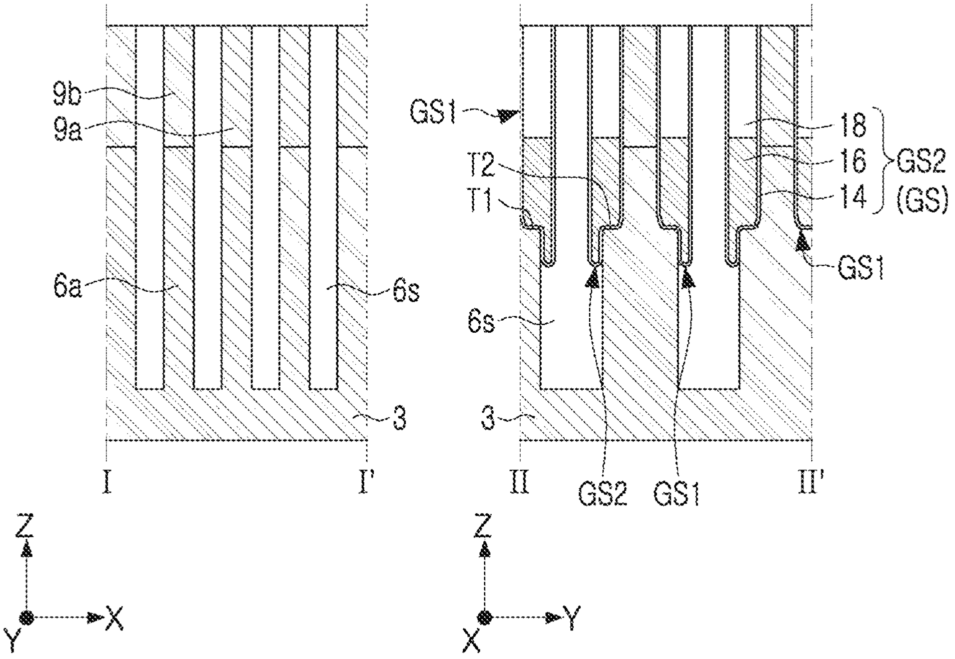
Figure 10D:
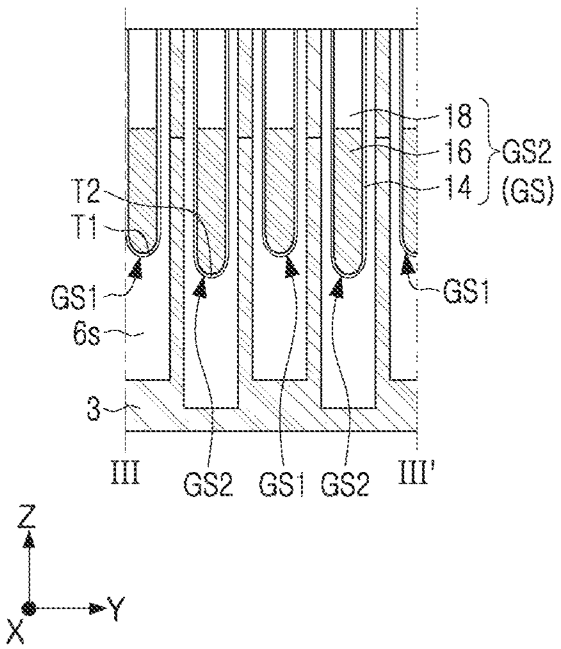

In some example embodiments, the device isolation layer 6*s* may include a first region 6*s*_1 and a second region 6*s*_2 lower than or below the first region 6*s*_1. When viewed from a plan view, the first region 6*s*_1 may correspond to a space between adjacent active regions 6*a* in the X-direction, and the second region 6*s*_2 may correspond to a space surrounded by up to four adjacent active regions 6*a*. FIG. 3C illustrates the first region 6*s*_1 of the device isolation layer 6*s*, and FIG. 3D illustrates the first and second regions 6*s*_1 and 6*s*_2 of the device isolation layer 6*s*. The horizontal width of the first region 6*s*_1 in the X-direction may be smaller than the horizontal width of the second region 6*s*_2 in the X-direction.

In some example embodiments, impurity regions may be formed by implanting impurities into the substrate 3 before or after the device isolation layer 6*s* is formed. For example, a first impurity region 9*a* may be formed in the center of the active region 6*a*, and a second impurity region 9*b* may be formed on both ends of the active region 6*a*. However, according to various example embodiments, the first impurity region 9*a* and the second impurity region 9*b* may be formed after the device isolation layer 6*s* is formed, e.g. at a high energy, and/or in another process operation.

Referring to FIGS. 4A to 4D, a protective layer 10 and a first mask layer 11 may be formed on the substrate 3. The protective layer 10 may be formed to cover upper surfaces of the active region 6*a* and the device isolation layer 6*s*. The protective layer 10 may protect or help to protect the active region 6*a* and the device isolation layer 6*s* in a subsequent process. The protective layer 10 may include silicon oxide, silicon nitride, silicon oxynitride, or combinations thereof. In some example embodiments, the protective layer 10 may include silicon nitride.

The first mask layer 11 may be formed on the protective layer 10. After the first mask layer 11 is formed, an etching process such as anisotropic etching process (e.g., a dry etching process) of etching the substrate 3 and the protective layer 10 together with the first mask layer 11 may be performed. In the etching process, first gate trenches T1 extending in the X-direction and spaced apart from each other in the Y-direction may be formed. The first gate trench T1 may be disposed in the cell area CA, and a portion of the first gate trench T1 may be disposed in the interface area IA. The first gate trench T1 may extend from the upper surface of the first mask layer 11 to the inside of the substrate 3 to expose the active region 6*a* and the device isolation layer 6*s*. In some example embodiments, the depth of the first gate trench T1 may not be constant. For example, the lower end of a portion of the first gate trench T1 overlapping the device isolation layer 6*s* in the Z-direction (vertical direction) may be located at a level lower than the lower end of a portion of the first gate trench T1 overlapping the active region 6*a* in the vertical direction.

Referring to FIGS. 5A to 5D, a sacrificial layer SA may be formed inside the first gate trench T1. For example, the sacrificial layer SA may extend in the X-direction along the first gate trench T1. The sacrificial layer SA may be formed by depositing an insulating material to fill the first gate trench T1. After the sacrificial layer SA is formed, a process of etching back the sacrificial layer SA and/or planarizing the sacrificial layer SA and the first mask layer 11 may be further performed. The sacrificial layer SA may include a material having an etching selectivity with the first mask layer 11. In some example embodiments, the sacrificial layer SA may include silicon oxide, silicon nitride, silicon oxynitride, silicon oxycarbonitride, polysilicon, a metal material, or combinations thereof.

Referring to FIGS. 6A to 6D, the first mask layer 11 may be removed, and an upper surface of the protective layer 10 and a side surface of the sacrificial layer SA may be exposed. The process of removing the first mask layer 11 may include an isotropic etching process such as wet etching process. Since the sacrificial layer SA includes a material having an etching selectivity with the first mask layer 11, the sacrificial layer SA may not be removed, or may be less removed, when the first mask layer 11 is removed. The protective layer 10 may also include a material having an etch selectivity with the first mask layer 11. Therefore, the protective layer 10 may not be removed when the first mask layer 11 is removed, and may protect or help to protect the active region 6*a* and the device isolation layer 6*s*.

Referring to FIGS. 7A to 7D, a spacer mask SM may be formed on a side surface of the sacrificial layer SA. The spacer mask SM may be formed by anisotropically etching the insulating material after forming an insulating material to cover the protective layer 10 and the sacrificial layer SA. The spacer mask SM may extend along a side surface of the sacrificial layer SA and may extend in the X-direction. When viewed from a plan view, the spacer mask SM may be disposed to surround the sacrificial layer SA. The spacer mask SM may not completely cover the protective layer 10, and the upper surface of the protective layer 10 may be partially exposed.

Referring to FIGS. 8A to 8D, a second mask layer 12 may be formed on the substrate 3. The second mask layer 12 may partially cover the protective layer 10, the sacrificial layer SA, and the spacer mask SM. For example, the opening of the second mask layer 12 may expose the cell area CA. The opening of the second mask layer 12 may also partially expose the interface area IA.

After the second mask layer 12 is formed, an anisotropic etching process may be performed using the second mask layer 12 as an etch mask, and a second gate trench T2 may be formed. The second gate trench T2 may extend in the X-direction along an area not covered by the spacer mask SM and the second mask layer 12, and the active region 6*a* and the device isolation layer 6*s* may be exposed. In some example embodiments, the depth of the second gate trench T2 may not be constant. For example, the lower end of a portion of the second gate trench T2 overlapping the device isolation layer 6*s* in the Z-direction (vertical direction) may be located at a level lower than the lower end of a portion of the second gate trench T2 overlapping the active region 6*a* in the vertical direction.

Referring to FIGS. 9A to 9D, the protective layer 10, the sacrificial layer SA, the spacer mask SM, and the second mask layer 12 may be removed. The upper surface of the substrate 3 may be exposed, and the first gate trench T1 and the second gate trench T2 may expose side surfaces of the active region 6*a* and the device isolation layer 6*s*. In a plan view, the first gate trenches T1 and the second gate trenches T2 may be alternately disposed. In some example embodiments, the length of the first gate trench T1 in the X-direction may be greater than the length of the second gate trench T2 in the X-direction, but example embodiments are not limited thereto. In some embodiments, the length of the first gate trench T1 in the X-direction may be less than or equal to the length of the second gate trench T2 in the X-direction. In some example embodiments, the depth of the first gate trench T1 may be the same as the depth of the second gate trench T2, but is not limited thereto.

Referring to FIGS. 10A to 10D, a first gate structure GS1 and a second gate structure GS2 may be formed in the first gate trench T1 and the second gate trench T2, respectively. Each of the first gate structure GS1 and the second gate structure GS2 may include a gate dielectric layer 14, a gate electrode 16, and a gate capping layer 18. The gate dielectric layer 14 may be formed, or conformally formed on inner walls of the gate trenches T1 and T2. The gate electrode 16 may be formed by forming a conductive material on the gate dielectric layer 14 and then recessing the conductive material. The gate capping layer 18 may be formed by forming an insulating material on the gate electrode 16 to fill, e.g., to wholly fill, the gate trenches T1 and T2 and then performing a planarization process. The first gate structure GS1 and the second gate structure GS2 may cross the active regions 6*a*, and each active region 6*a* may overlap one of the first gate structures GS1 and one of the second gate structures GS2 in the vertical direction.

According to various example embodiments, the process of forming the first gate trench T1 may not performed simultaneously with the process of forming the second gate trench T2. Therefore, compared to the case in which the gate trenches T1 and T2 are simultaneously formed, the semiconductor device 100 may be formed with a finer pattern and the occurrence of defects may be prevented or reduced in likelihood of occurrence and/or in impact from occurrence. In some example embodiments, since the first gate trench T1 is formed by a process separate from the second gate trench T2, the length of the first gate structure GS1 in at least one of the X-direction, the Y-direction, and the vertical direction (Z-direction) may be different from the length of the second gate structure GS2. For example, one or more of the length in the X-direction, the width in the Y-direction, or the depth in the vertical direction, of the first gate structure GS1, may be different from the second gate structure GS2.

Referring back to FIGS. 2A to 2E, the buffer layer 21, the bit line structure BLS, and the spacer structure SP may be formed on the substrate 3. The buffer layer 21 may be formed on upper surfaces of the substrate 3, the active region 6*a*, the device isolation layer 6*s*, and the gate structure GS. The buffer layer 21 may be comprised of a single layer or a plurality of layers.

The bit line structure BLS may be formed on the buffer layer 21. The bit line structure (BLS) may be formed by forming the contact hole H by etching the buffer layer 21 to expose the active region 6*a*, stacking conductive material layers on the contact hole (H), forming insulating material layers on the conductive material layers, and patterning the conductive material layers and the insulating material layers. The bit line structures BLS may extend in the Y-direction and may be spaced apart from each other in the X-direction.

The bit line structure BLS may include a bit line BL including a conductive material and a bit line capping layer 28 including an insulating material. The bit line BL may include a first conductive layer 25*a*, a second conductive layer 25*b*, and a third conductive layer 25*c* sequentially stacked. The first conductive layer 25*a* may include a plug portion 25*p* disposed in the contact hole H. The bit line capping layer 28 may include a first insulating layer 28*a*, a second insulating layer 28*b*, and a third insulating layer 28*c* sequentially stacked.

The spacer structure SP may be formed on both side surfaces of the bit line structure BLS. The spacer structure SP may include a first spacer SP1, a second spacer SP2, a third spacer SP3, and a fourth spacer SP4. The first spacer SP1 may be formed by conformally depositing an insulating material along the side surface of the bit line structure BLS and the inner wall of the contact hole H. The second spacer SP2 may be formed by depositing an insulating material on the first spacer SP1 to fill the contact hole H. The third spacer SP3 and the fourth spacer SP4 may be formed by forming an insulating material to cover side surfaces of the second spacer SP2 and the third spacer SP3 and etching the insulating material. The spacer structure SP may extend in the Y-direction along the side of the bit line structure BLS.

After the spacer structure SP is formed, a process of etching the buffer layer 21 may be performed to expose the upper surface of the active region 6*a*. A space between the bit line structures BLS may be referred to as a trench. For example, the trench may be defined by mutually opposing side surfaces of adjacent spacer structures SP and may extend in the Y-direction.

A contact plug 60 may be formed in the trench. The contact plug 60 may be formed by filling the trench with a conductive material to cover the spacer structure SP and etching back the conductive material. An upper surface of the contact plug 60 may be located at a level lower than an upper surface of the bit line structure BLS. The contact plug 60 may contact the upper surface of the active region 6*a* and may partially fill a space between the spacer structures SP. Thereafter, a portion of the spacer structure SP may be etched by an etching process. For example, upper portions of the first spacer SP1, the third spacer SP3, and the fourth spacer SP4 may be partially removed. The contact plug 60 may be electrically connected to the active region 6*a*, for example, the second impurity region 9*b*.

In various example embodiments, after the contact plug 60 is formed, the fence structure 63 illustrated in FIGS. 2D and 2E may be formed. The fence structure 63 may be formed by removing a portion of the contact plug 60 and then filling the space in which a portion of the contact plug 60 has been removed with an insulating material. The fence structures may be formed to overlap the gate structure GS between the bit line structures BLS in a vertical direction. The fence structures may be spaced apart from each other in the X and Y-directions. For example, the contact plugs 60 may be alternately disposed with the fence structures 63 in the Y-direction between the bit line structures BLS. In some example embodiments, the process of forming the fence structure 63 may be performed prior to the process of forming the contact plug 60.

A barrier layer 69*a* and a metal layer 69*b* may be formed on the bit line structure BLS, the spacer structure SP, and the contact plug 60. A landing pad 69 and an insulating pattern 72 may be formed by patterning the barrier layer 69*a* and the metal layer 69*b* and by filling with an insulating material. The metal-semiconductor compound layer 66 may be formed between the contact plug 60 and the landing pad 69. The landing pad 69 may also cover the fence structure 63. The metal-semiconductor compound layer 66 may be formed by siliciding a portion of the contact plug 60.

In some example embodiments, before the landing pad 69 is formed, a bit line structure BLS protruding from the upper surface of the contact plug 60, and an upper insulating spacer 50 covering the upper portion of the spacer structure SP, may be further formed. The barrier layer 69*a* may conformally cover the upper insulating spacer 50. The upper insulating spacer 50 may also cover an upper portion of the fence structure 63 protruding from the upper surface of the contact plug 60.

The semiconductor device 100 may be manufactured or fabricated by forming the etch stop layer 75 and the capacitor structure 80 on the landing pad 69. The etch stop layer 75 may be formed to cover upper surfaces of the landing pad 69 and the insulating pattern 72. The capacitor structure 80 may include a lower electrode 82 passing through the etch stop layer 75 and connected to the landing pad 69, a capacitor dielectric layer 84 on the lower electrode 82, and an upper electrode 86 on the capacitor dielectric layer 84.

Figure 11:
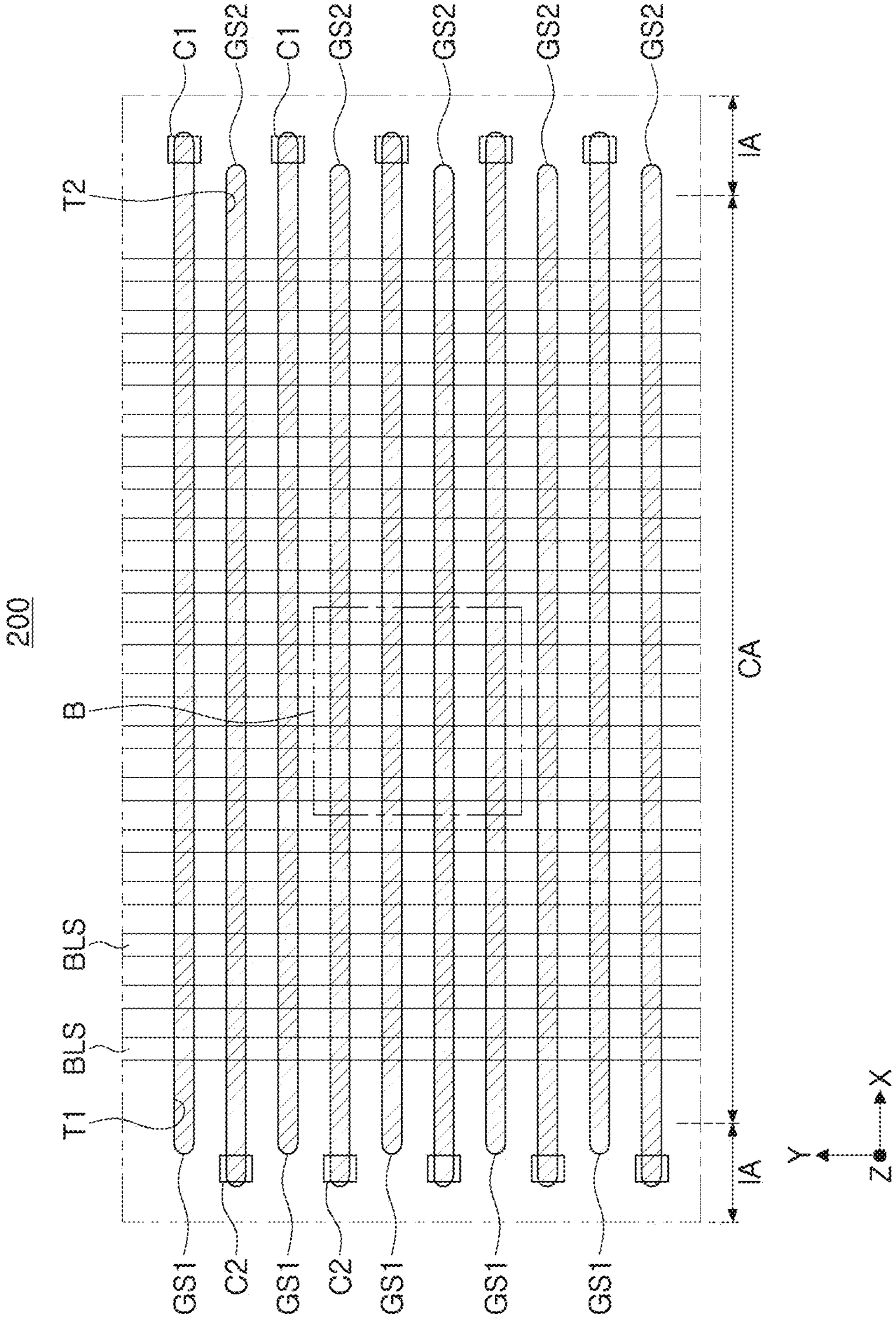
FIG. 11 is a plan view of a semiconductor device according to some example embodiments.

FIG. 11 is a plan view of a semiconductor device according to some example embodiments.

Referring to FIG. 11, a semiconductor device 200 may include first gate structures GS1 and second gate structures GS2 extending in the X-direction and alternately disposed in the Y-direction. In some example embodiments, the first gate contact C1 may not overlap the second gate structure GS2 in the Y-direction. The second gate contact C2 may not overlap the first gate structure GS1 in the Y-direction. For example, the first gate contact C1 may be disposed farther from the cell area CA than an end of the adjacent second gate structure GS2. The second gate contact C2 may be disposed farther from the cell area CA than an end of the adjacent first gate structure GS1. Since the first gate contact C1 and the second gate contact C2 do not overlap with the gate structure GS in the Y-direction, a short circuit with the adjacent gate structure GS may be prevented. In addition, since more space for forming the first gate contact C1 and the second gate contact C2 may be more likely to be secured, the size of the semiconductor device 200 may be further reduced and/or a yield of the semiconductor device 200 may be increased. In some example embodiments, the length of the first gate structure GS1 in the X-direction may be the same as the length of the second gate structure GS2 in the X-direction, but example embodiments are not limited thereto. The center of the first gate structure GS1 in the X-direction may be displaced in the Y direction from the center of the second gate structure GS2 in the X-direction.

Figure 12:
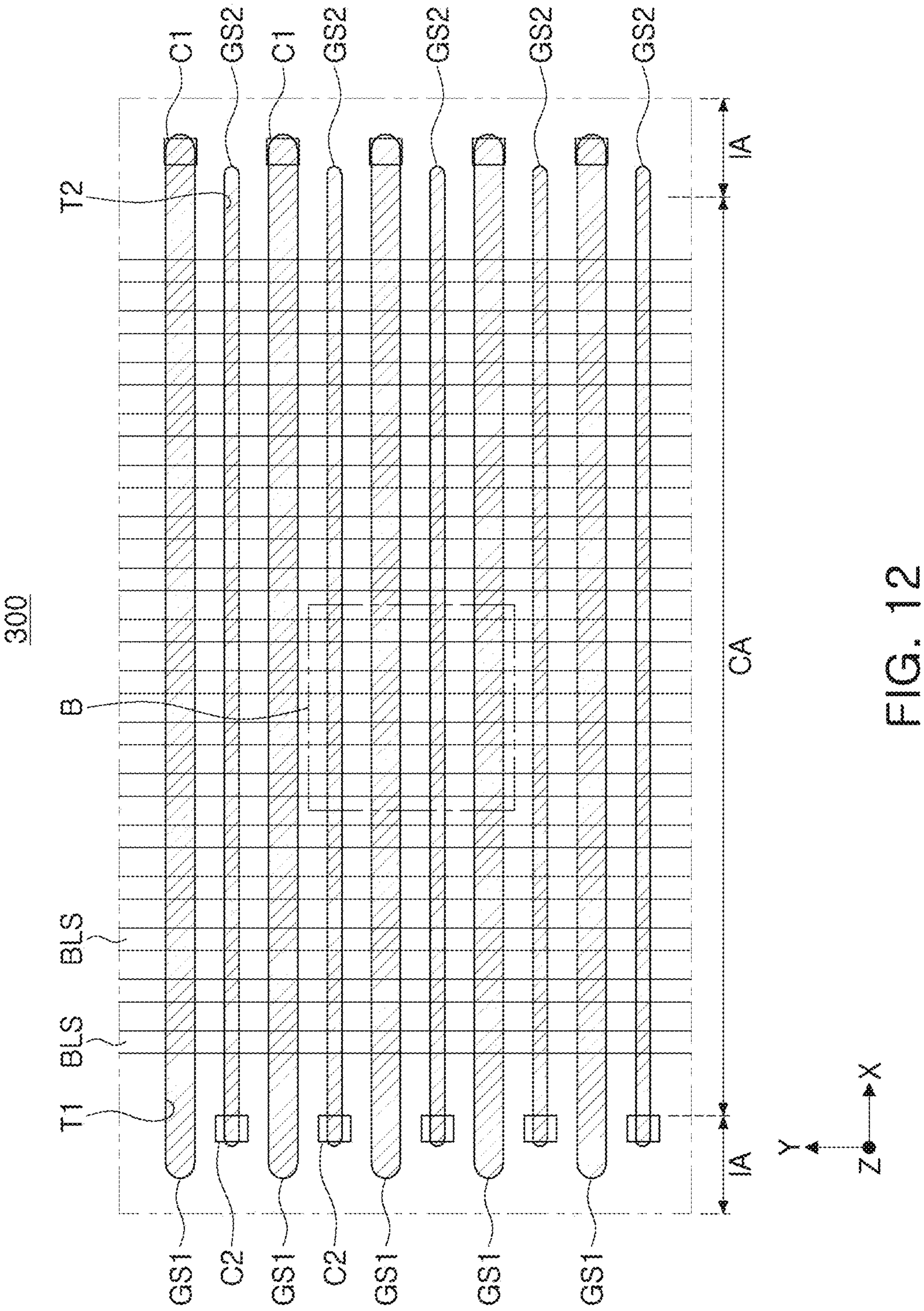
FIG. 12 is a plan view of a semiconductor device according to some example embodiments.

FIG. 12 is a plan view of a semiconductor device according to some example embodiments.

Referring to FIG. 12, a semiconductor device 300 may include first gate structures GS1 and second gate structures GS2 extending in the X-direction and alternately disposed in the Y-direction. In some example embodiments, the horizontal width of the first gate structure GS1 in the Y-direction may be different from the horizontal width of the second gate structure GS2 in the Y-direction. For example, since the first gate trench T1 and the second gate trench T2 are not formed simultaneously, the first gate structure GS1 may be formed to be wider than the second gate structure GS2. Alternatively or additionally, the length of the first gate structure GS1 in the X-direction may be greater than the length of the second gate structure GS2 in the X-direction.

Figure 13:
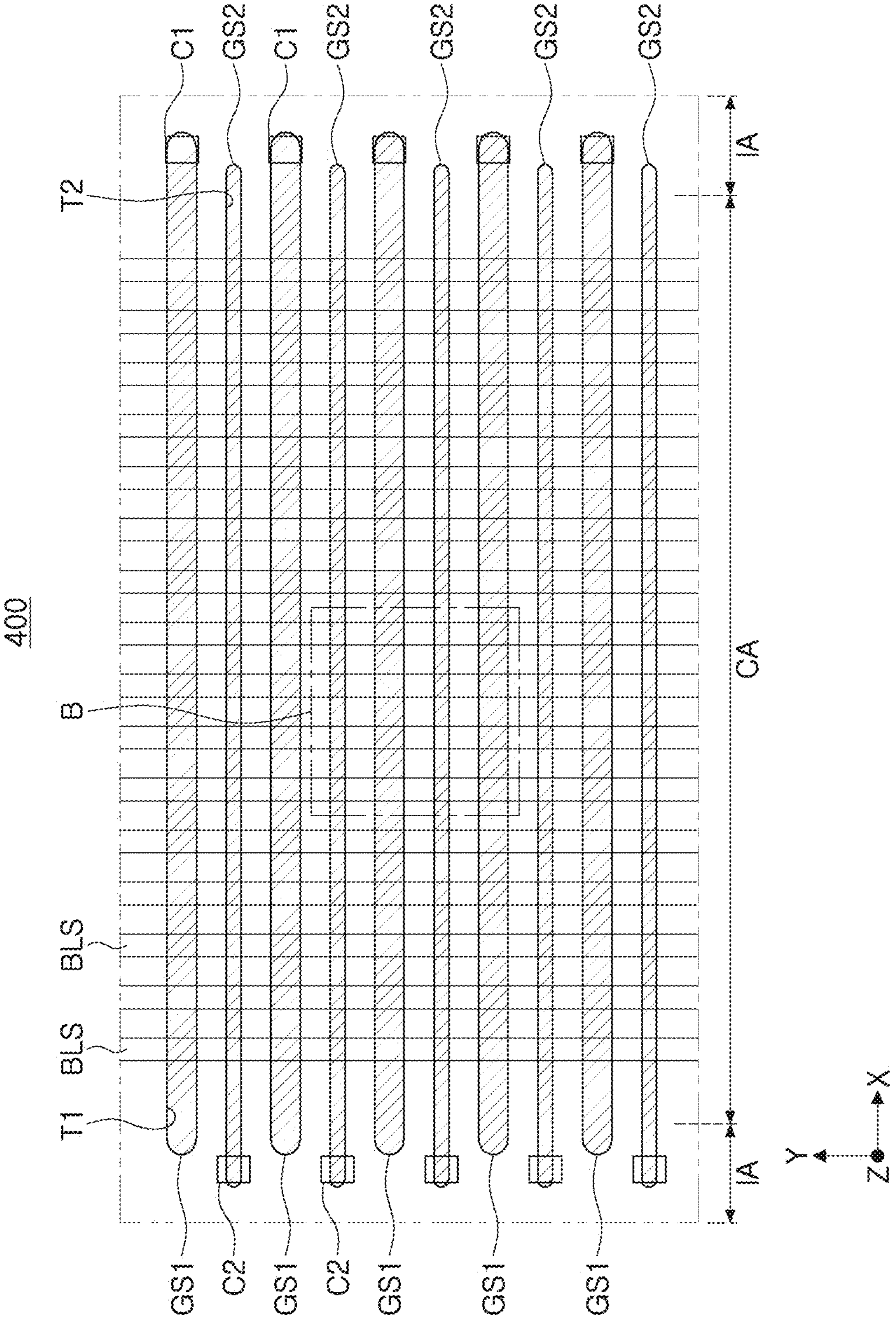
FIG. 13 is a plan view of a semiconductor device according to some example embodiments.

FIG. 13 is a plan view of a semiconductor device according to some example embodiments.

Referring to FIG. 13, a semiconductor device 400 may include first gate structures GS1 and second gate structures GS2 extending in the X-direction and alternately disposed in the Y-direction. Unlike the semiconductor device 300 of FIG. 12, the first gate contact C1 may not overlap the second gate structure GS2 in the Y-direction, and the second gate contact C2 may not overlap the first gate structure GS1 in the Y-direction. The length of the first gate structure GS1 in the X-direction may be the same as the length of the second gate structure GS2 in the X-direction.

Figure 14:
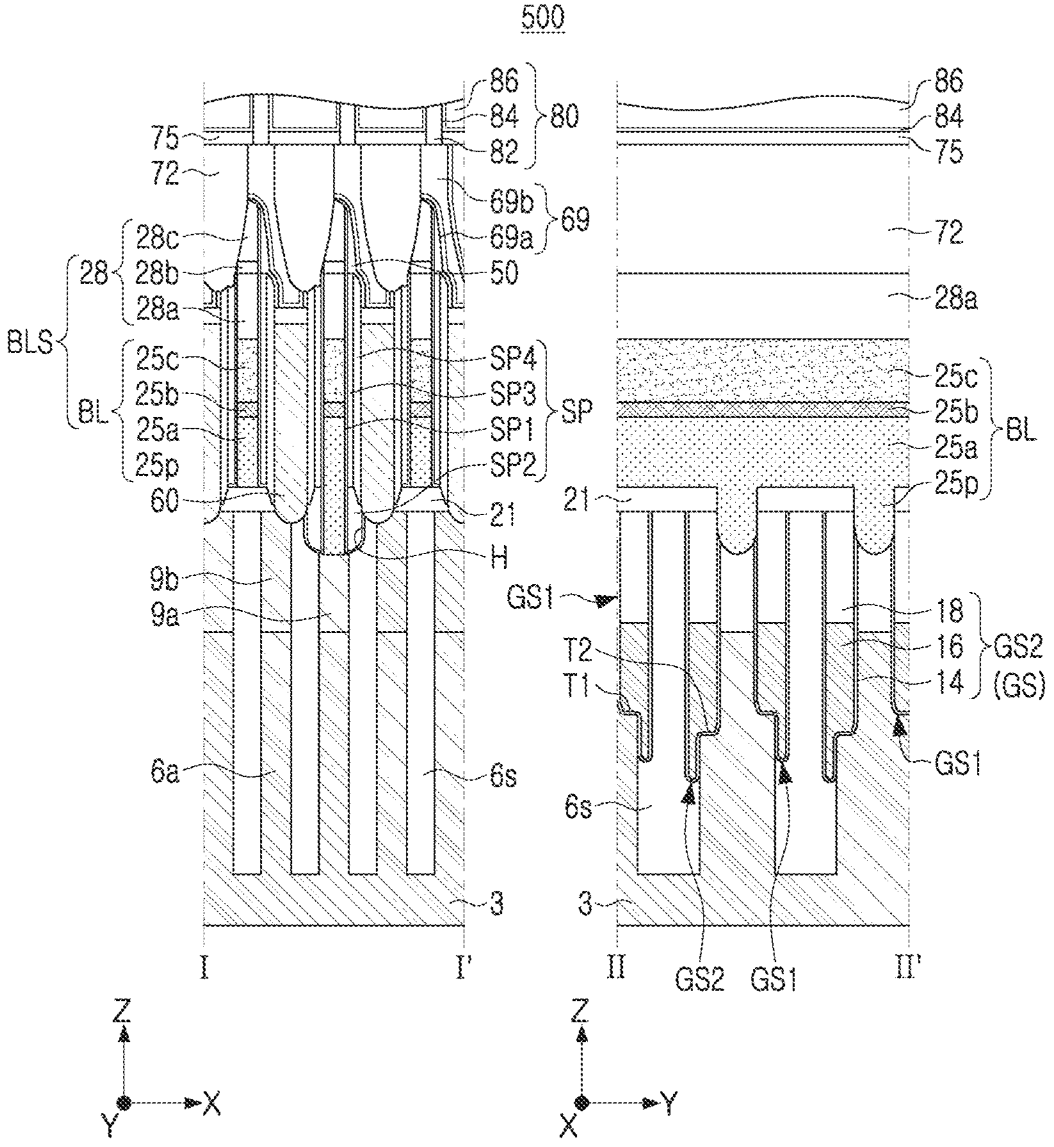
FIGS. 14 and 15 are vertical cross-sectional views of a semiconductor device according to some example embodiments.
Figure 15:
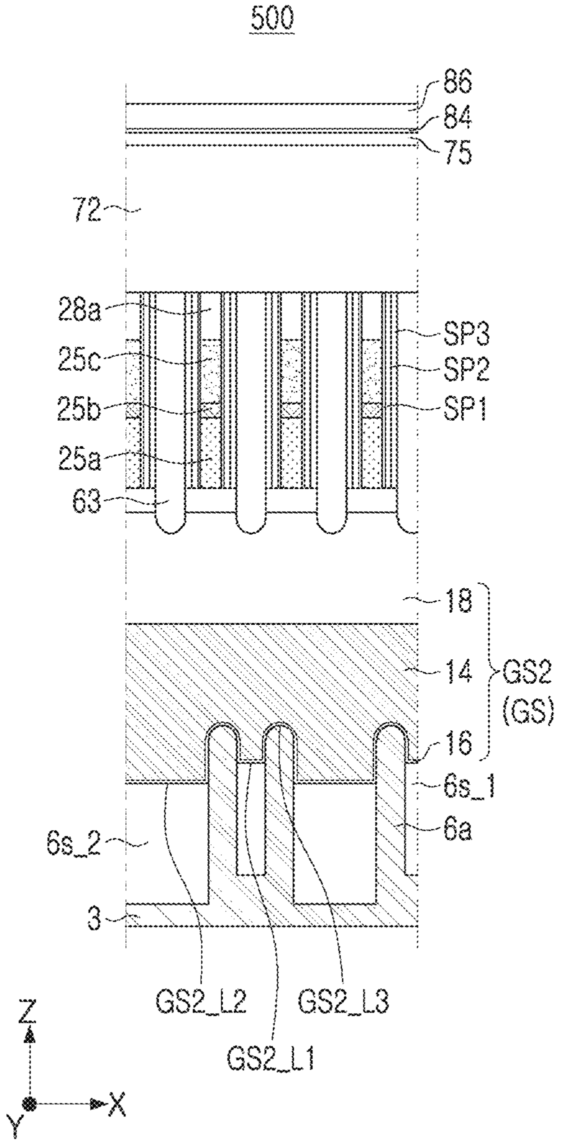

FIGS. 14 and 15 are vertical cross-sectional views of a semiconductor device according to some example embodiments. FIG. 15 is a cross-sectional view of the second gate structure GS2 unlike FIG. 2E.

Referring to FIGS. 2E, 14, and 15, a semiconductor device 500 may include first gate structures GS1 and second gate structures GS2 alternately disposed in the Y-direction. In some example embodiments, the depth of the first gate structure GS1 may be smaller than the depth of the second gate structure GS2. In detail, a lower surface of the first gate structure GS1 may include a first portion GS1_L1 in contact with the first region 6*s*_1 of the device isolation layer 6*s*, a second portion GS1_L2 contacting the second region 6*s*_2 of the device isolation layer 6*s*, and a third portion GS1_L3 contacting the active region 6*a*. A lower surface of the second gate structure GS2 may include a first portion GS2_L1, a second portion GS2_L2, and a third portion GS2_L3. The first portion GS2_L1, the second portion GS2_L2, and the third portion GS2_L3 of the lower surface of the second gate structure GS2 may be located at lower levels than the first portion GS1_L1, the second portion GS1_L2, and the third portion GS1_L3 of the lower surface of the first gate structure GS1, respectively.

Figure 16:
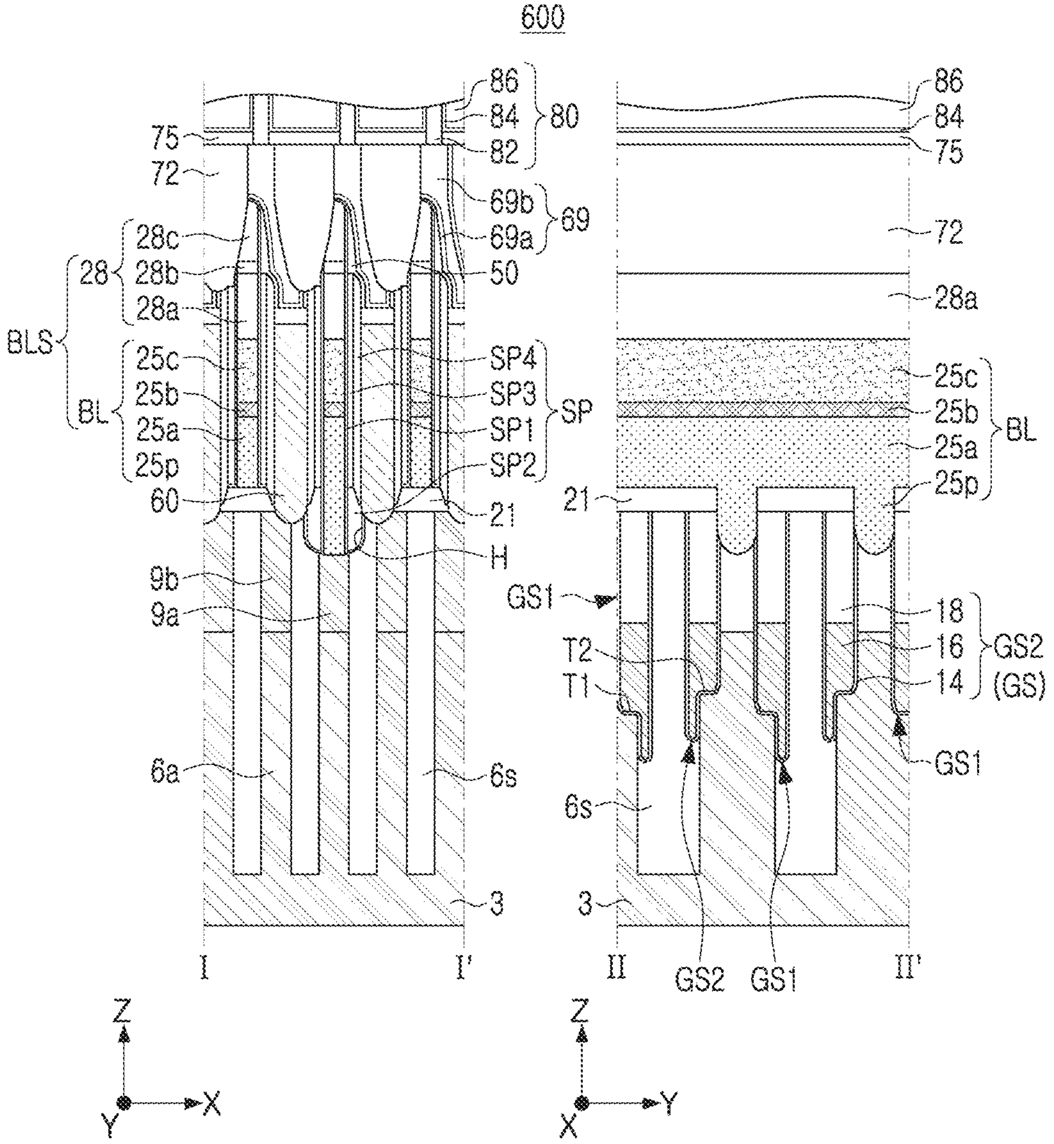
FIGS. 16 and 17 are vertical cross-sectional views of a semiconductor device according to some example embodiments.
Figure 17:
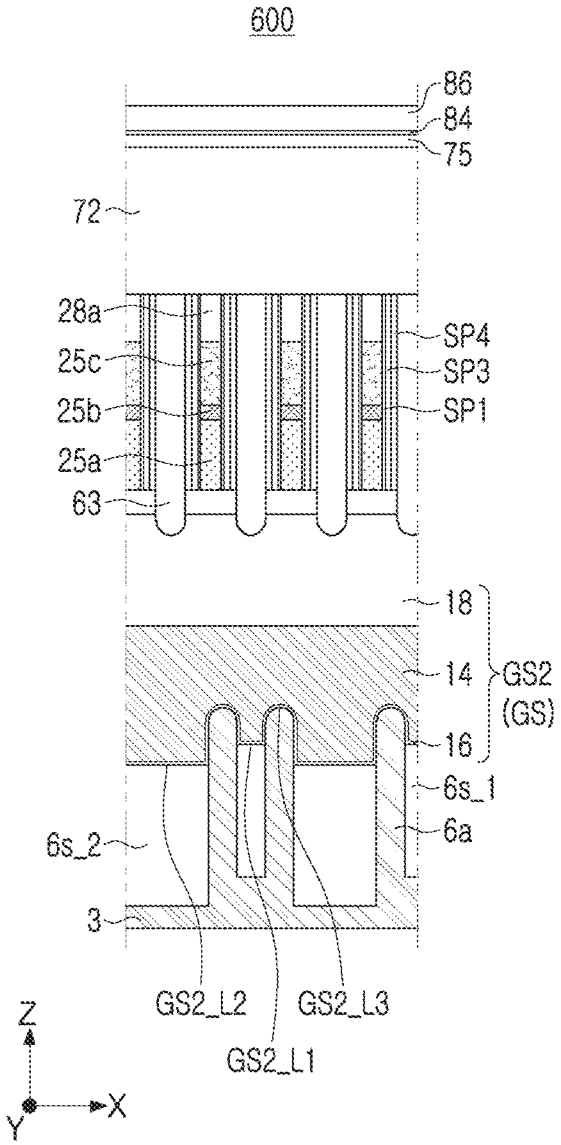

FIGS. 16 and 17 are vertical cross-sectional views of a semiconductor device according to some example embodiments. Referring to FIGS. 2E, 16 and 17, a semiconductor device 600 may include first gate structures GS1 and second gate structures GS2 alternately disposed in the Y-direction. In some example embodiments, the depth of the first gate structure GS1 may be greater than the depth of the second gate structure GS2. For example, the first portion GS2_L1, the second portion GS2_L2, and the third portion GS2_L3 of the lower surface of the second gate structure GS2 may be located at levels higher than the first portion GS1_L1, the second portion GS1_L2, and the third portion GS1_L3 of the lower surface of the first gate structure GS1.

As set forth above, according to example embodiments, the first gate trench may be formed in a separate process from a process of the second gate trench. Accordingly, the first and second gate trenches may be formed in relatively finer patterns, and a miniaturized semiconductor device may be provided.

While various example embodiments have been illustrated and described above, it will be apparent to those of ordinary skill in the art that modifications and variations could be made without departing from the scope of the present inventive concept as defined by the appended claims. Furthermore, example embodiments are not necessarily mutually exclusive with one another. For example, some example embodiments may include one or more features described with reference to one or more figures, and may also include one or more other features described with reference to one or more other figures.

What is claimed is:

1. A semiconductor device comprising:

a substrate including a plurality of active regions, and defining a plurality of first gate trenches and a plurality of second gate trenches crossing the plurality of active regions and extending in a first horizontal direction;

a plurality of gate structures including a plurality of first gate structures within the plurality of first gate trenches and a plurality of second gate structures within the plurality of second gate trenches;

a bit line structure crossing the plurality of gate structures and extending in a second horizontal direction that intersects the first horizontal direction; and a contact plug on a side surface of the bit line structure, wherein, when viewed in plan view, an area of at least some of the plurality of first gate structures is different from an area of at least some of the plurality of second gate structures, and wherein a length in the first horizontal direction of the plurality of first gate structures is different from a length in the first horizontal direction of the plurality of second gate structures.

2. The semiconductor device of claim 1, wherein a depth of at least some of the plurality of first gate structures is different from a depth of at least some of the plurality of second gate structures.

3. The semiconductor device of claim 1, wherein centers of the plurality of first gate structures in the first horizontal direction are displaced from centers of the plurality of second gate structures in the first horizontal direction.

4. The semiconductor device of claim 1, further comprising:

a plurality of gate contacts on the plurality of gate structures and electrically connected to the plurality of gate structures, wherein the plurality of gate contacts are arranged in a zigzag pattern in the second horizontal direction.

5. The semiconductor device of claim 4, wherein the plurality of gate contacts include a plurality of first gate contacts at least partly overlapping ends of the plurality of first gate structures in a vertical direction and spaced apart from each other in the second horizontal direction, and the plurality of first gate contacts do not overlap the plurality of second gate structures in the second horizontal direction.

6. The semiconductor device of claim 5, wherein the plurality of gate contacts include a plurality of second gate contacts at least partly overlapping ends of the plurality of second gate structures in the vertical direction and spaced apart from each other in the second horizontal direction, and the plurality of second gate contacts do not overlap the plurality of first gate structures in the second horizontal direction.

7. The semiconductor device of claim 5, wherein a pitch of the plurality of first gate contacts is twice a pitch of the plurality of gate structures.

8. The semiconductor device of claim 1, wherein a horizontal width of the plurality of first gate structures in the second horizontal direction is different from a horizontal width of the plurality of second gate structures in the second horizontal direction.

9. The semiconductor device of claim 8, wherein lengths of the plurality of first gate structures in the first horizontal direction are different from lengths of the plurality of second gate structures in the first horizontal direction.

10. The semiconductor device of claim 1, wherein respective active regions overlap one of the plurality of first gate structures and one of the plurality of second gate structures in a vertical direction.

11. The semiconductor device of claim 1, wherein the substrate further includes a device isolation layer between the plurality of active regions, and the device isolation layer includes a first region and a second region deeper than the first region.

12. The semiconductor device of claim 11, wherein a lower surface of each of the plurality of first gate structures includes a first portion contacting the first region of the device isolation layer and a second portion contacting the second region of the device isolation layer and lower than the first portion.

13. The semiconductor device of claim 1, wherein in cross-section a radius of curvature of a bottom of the plurality of first gate trenches is same as a radius of curvature of a bottom of the plurality of second gate trenches.

14. A semiconductor device comprising:

a substrate including a plurality of active regions and defining a plurality of first gate trenches and a plurality of second gate trenches crossing the plurality of active regions and extending in a first horizontal direction;

a plurality of gate structures including a plurality of first gate structures within the plurality of first gate trenches and a plurality of second gate structures within the plurality of second gate trenches;

a bit line structure crossing the plurality of gate structures and extending in a second horizontal direction that intersects the first horizontal direction; and a contact plug on a side surface of the bit line structure, wherein the plurality of first gate structures are alternately arranged with the plurality of second gate structures in the second horizontal direction, and the plurality of first gate structures have a length different from a length of the plurality of second gate structures in at least one direction among the first horizontal direction, the second horizontal direction, and a vertical direction.

15. The semiconductor device of claim 14, further comprising:

a device isolation layer between the plurality of active regions, wherein the device isolation layer includes a first region and a second region deeper than the first region.

16. The semiconductor device of claim 15, wherein a lower surface of each of the plurality of first gate structures includes a first portion in contact with the first region of the device isolation layer, a lower surface of each of the plurality of second gate structures includes a first portion in contact with the first region of the device isolation layer, and the first portion of the lower surface of each of the plurality of first gate structures is above or below the first portion of the lower surface of each of the plurality of second gate structures.

17. The semiconductor device of claim 15, wherein a lower surface of each of the plurality of first gate structures includes a second portion in contact with the second region of the device isolation layer, a lower surface of each of the plurality of second gate structures includes a second portion in contact with the second region of the device isolation layer, and the second portion of the lower surface of each of the plurality of first gate structures is above or below the second portion of the lower surface of each of the plurality of second gate structures.

18. The semiconductor device of claim 15, wherein a lower surface of each of the plurality of first gate structures includes a third portion in contact with the plurality of active regions of the device isolation layer, a lower surface of each of the plurality of second gate structures includes a third portion in contact with the plurality of active regions of the device isolation layer, and the third portion of the lower surface of each of the plurality of first gate structures is above or below the third portion of the lower surface of each of the plurality of second gate structures.

19. A semiconductor device comprising:

a substrate including a plurality of active regions, and defining a plurality of first gate trenches and a plurality of second gate trenches crossing the plurality of active regions and extending in a first horizontal direction;

a plurality of gate structures including a plurality of first gate structures within the plurality of first gate trenches and a plurality of second gate structures within the plurality of second gate trenches;

a bit line structure crossing the plurality of gate structures and extending in a second horizontal direction, intersecting the first horizontal direction;

a contact plug disposed on a side surface of the bit line structure;

a landing pad on the contact plug; and a capacitor structure electrically connected to the landing pad, wherein the plurality of first gate structures are alternately arranged with the plurality of second gate structures in the second horizontal direction, and first and second ends of the plurality of first gate structures that are spaced apart from each other in the first horizontal direction are arranged in a zigzag pattern with first and second ends of respective second gate structures that are spaced apart from each other in the first horizontal direction.

20. The semiconductor device of claim 19, wherein, when viewed from a plan view, at least one of a length and a horizontal width of the plurality of first gate structures is different from a respective one of the length and horizontal width of the plurality of second gate structures.

* * * * *